(12) United States Patent
Tsai et al.

(10) Patent No.: US 11,139,222 B2
(45) Date of Patent: Oct. 5, 2021

(54) ELECTRONIC DEVICE COMPRISING HEAT PIPE CONTACTING A COVER STRUCTURE FOR HEAT DISSIPATION

(71) Applicant: Advanced Semiconductor Engineering, Inc., Kaohsiung (TW)

(72) Inventors: Jung-Che Tsai, Kaohsiung (TW); Ian Hu, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 24 days.

(21) Appl. No.: 16/566,502

(22) Filed: Sep. 10, 2019

(65) Prior Publication Data

US 2020/0083143 A1 Mar. 12, 2020

Related U.S. Application Data

(60) Provisional application No. 62/730,526, filed on Sep. 12, 2018.

(51) Int. Cl.
*H01L 23/427* (2006.01)
*H01L 23/36* (2006.01)
*H01L 23/00* (2006.01)

(52) U.S. Cl.
CPC ............ *H01L 23/427* (2013.01); *H01L 23/36* (2013.01); *H01L 24/16* (2013.01); *H01L 24/48* (2013.01); *H01L 24/49* (2013.01); *H01L 2224/16225* (2013.01); *H01L 2224/48091* (2013.01); *H01L 2224/73253* (2013.01); *H01L 2924/151* (2013.01); *H01L 2924/16152* (2013.01)

(58) Field of Classification Search
CPC ... H01L 23/36; H01L 23/427; H01L 23/4334; H01L 23/46; H01L 2924/151; H01L 2924/16152
See application file for complete search history.

(56) References Cited

U.S. PATENT DOCUMENTS

2006/0133039 A1* 6/2006 Belady ................. H01L 23/473
361/699

* cited by examiner

*Primary Examiner* — Hoai V Pham
(74) *Attorney, Agent, or Firm* — Foley & Lardner LLP

(57) ABSTRACT

An electronic device includes a main substrate, a semiconductor package structure and at least one heat pipe. The semiconductor package structure is electrically connected to the main substrate, and includes a die mounting portion, a semiconductor die and a cover structure. The semiconductor die is disposed on the die mounting portion. The cover structure covers the semiconductor die. The heat pipe contacts the cover structure for dissipating a heat generated by the semiconductor die.

19 Claims, 47 Drawing Sheets

ELECTRONIC DEVICE COMPRISING HEAT PIPE CONTACTING A COVER STRUCTURE FOR HEAT DISSIPATION

CROSS-REFERENCE TO RELATED APPLICATIONS

This application claims the benefit of and priority to U.S. Provisional Application No. 62/730,526, filed Sep. 12, 2018, the contents of which are incorporated herein by reference in their entirety.

BACKGROUND

1. Field of the Disclosure

The present disclosure relates to an electronic device, and to an electronic device including at least one heat pipe.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, an electronic device includes a main substrate, a semiconductor package structure and at least one heat pipe. The semiconductor package structure is electrically connected to the main substrate, and includes a die mounting portion, a semiconductor die and a cover structure. The semiconductor die is disposed on the die mounting portion. The cover structure covers the semiconductor die. The heat pipe contacts the cover structure for dissipating a heat generated by the semiconductor die.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
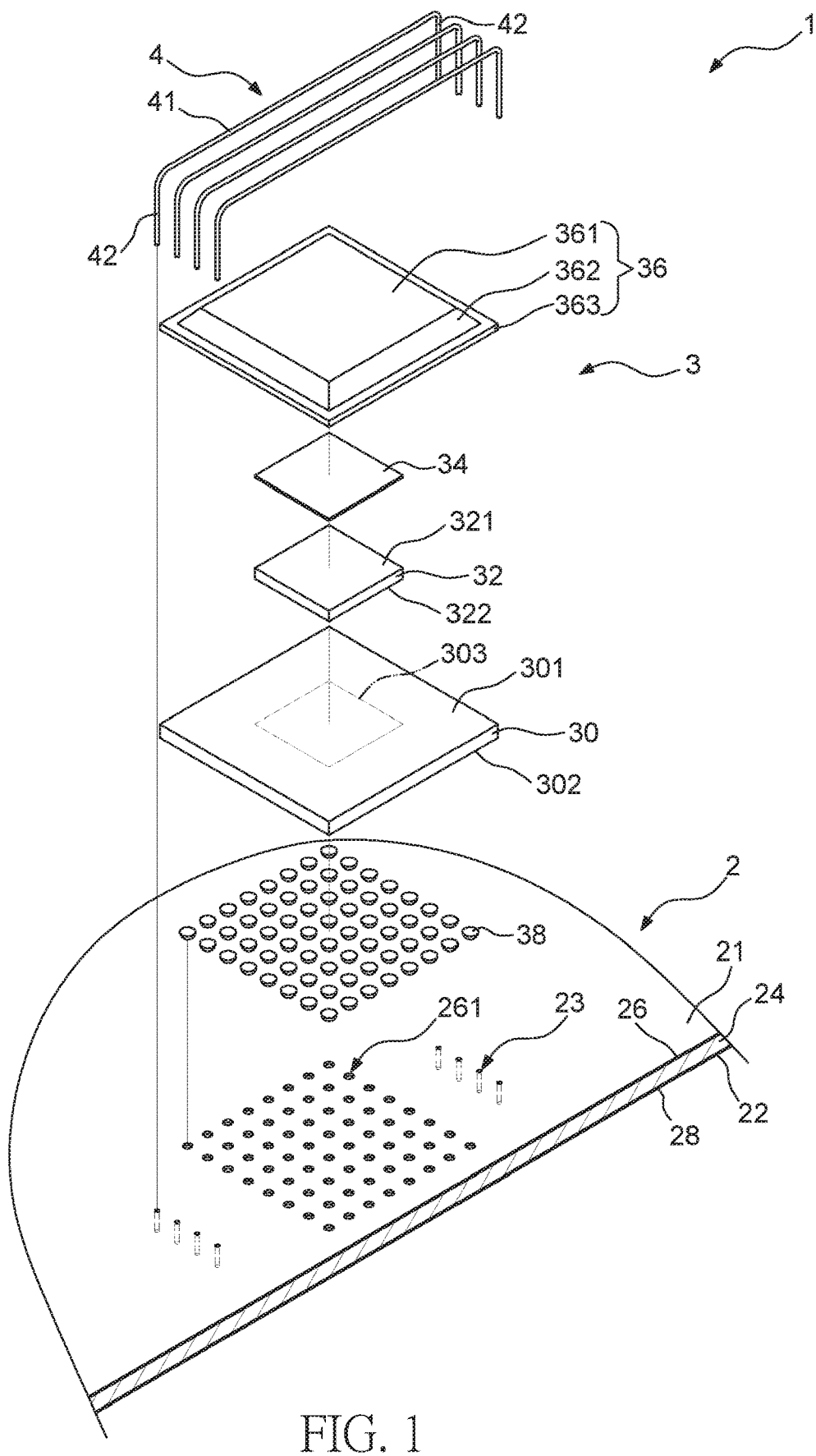
FIG. 1 illustrates an exploded perspective view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a number of substrate vias or a thickness of metal layer are increased. However, the improvement of heat dissipation efficiency is slight. In some comparative embodiments, a thermal interface material (TIM) is used to be interposed between the devices and the package substrate. However, the temperature of the device at the center of the semiconductor package structure may not be hugely reduced.

At least some embodiments of the present disclosure provide for an electronic device which has a high improvement of heat dissipation efficiency. In some embodiments, the electronic device includes at least one heat pipe contacting a cover structure of a semiconductor package structure for dissipating a heat generated by a semiconductor die of the semiconductor package structure.

Figure 2:
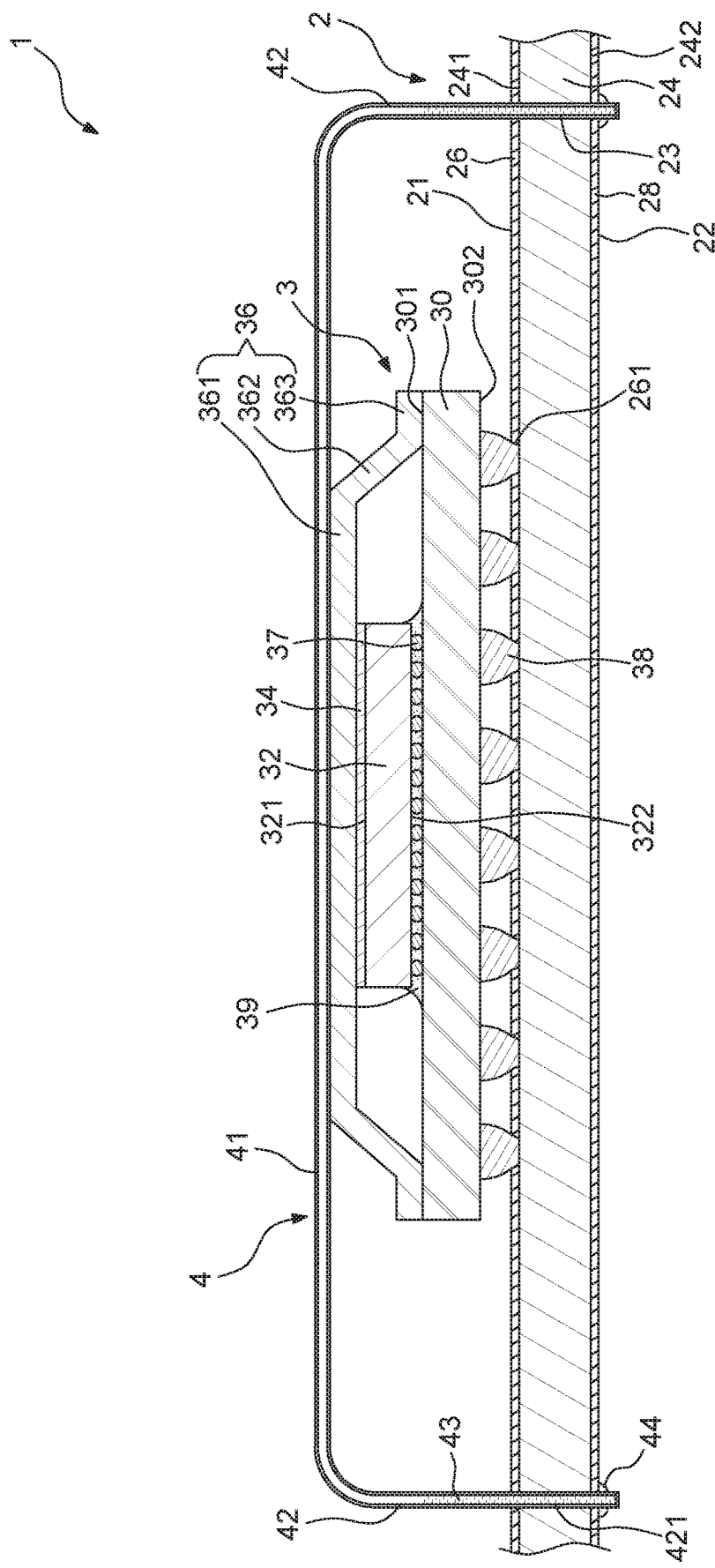
FIG. 2 illustrates an assembled cross-sectional view of the electronic device of FIG. 1.

FIG. 1 illustrates an exploded perspective view of an electronic device 1 according to some embodiments of the present disclosure. FIG. 2 illustrates an assembled cross-sectional view of the electronic device 1 of FIG. 1. The electronic device 1 includes a main substrate 2, a semiconductor package structure 3 and at least one heat pipe 4

The main substrate 2 (e.g., a printed circuit board, PCB) has a first surface 21 (e.g., a top surface) and a second surface 22 (e.g., a bottom surface) opposite to the first surface 21, and includes a main body 24, a first protection layer 26, a second protection layer 28. The main body 24 has a first surface 241 (e.g., a top surface) and a second surface 242 (e.g., a bottom surface) opposite to the first surface 241. The main body 24 may include a plurality of passivation layers (not shown) and a plurality of circuit layers (not shown) interposed between the passivation layers. The first protection layer 26 and the second protection layer 28 may be solder resist layers. The first protection layer 26 may be disposed on the first surface 241 of the main body 24, and the second protection layer 28 may be disposed on the second surface 242 of the main body 24. As shown in FIG. 1, the main substrate 2 defines a plurality of through holes 23 extending the main substrate 2. That is, the through holes 23 extend through the main body 24, the first protection layer 26 and the second protection layer 28. In addition, the first protection layer 26 may define a plurality of openings 261 extending through the first protection layer 26 to expose portions of the circuit layer of the main body 24. That is, the openings 261 do not extend through the main body 24 and the second protection layer 28.

The semiconductor package structure 3 may be a flip-chip ball grid array (BGA) package, and is electrically connected to the first surface 21 of the main substrate 2. The semiconductor package structure 3 includes a package substrate 30, a semiconductor die 32, a thermal adhesive material 34, a cover structure 36, a plurality of inner connecting elements 37 (e.g., solder bumps) and a plurality of external connecting elements 38 (e.g., solder bumps). The package substrate 30 has a first surface 301 (e.g., a top surface) and a second surface 302 (e.g., a bottom surface) opposite to the first surface 301, and may include a plurality of passivation layers and at least one circuit layer (e.g., redistribution layer, RDL) interposed between the passivation layers. The package substrate 30 may further include a die mounting portion 303 for receiving the semiconductor die 32.

The semiconductor die 32 is electrically connected to the first surface 301 of the package substrate 30. The semiconductor die 32 has a first surface 321 (e.g., a backside surface) and a second surface 322 (e.g., an active surface) opposite to the first surface 321, and includes the inner connecting elements 37 (e.g., solder bumps) disposed adjacent to the second surface 322 thereof. The semiconductor die 32 is attached to the die mounting portion 303 of the package substrate 30, and is electrically connected to the first surface 301 of the package substrate 30 through the inner connecting elements 37 (e.g., solder bumps) by flip-chip bonding. An underfill 39 may be further included to cover and protect the inner connecting elements 37 (e.g., solder bumps). The cover structure 36 may be a metal lid structure that covers the semiconductor die 32. The cover structure 36 (e.g., the metal lid structure) is a cap structure or hat structure, and includes a base plate 361, a periphery side wall 362 and a bottom rim portion 363. The periphery side wall 362 extends from the base plate 361 to the bottom rim portion 363 so as to define an accommodating space for accommodating the semiconductor die 32. The cover structure 36 (e.g., the metal lid structure) may be formed integrally as a one-piece structure. The bottom rim portion 363 is attached or adhered to the first surface 301 of the package substrate 30.

The thermal adhesive material 34 (e.g., a thermal interface material (TIM) with a thermal conductivity of greater than or equal to about 3 W/mK, about 4 W/mK, or about 5 W/mK) is interposed between the semiconductor die 32 and the cover structure 36 (e.g., the metal lid structure). That is, the thermal adhesive material 34 (e.g., a thermal interface material (TIM) is used to adhere the first surface 321 of the semiconductor die 32 to the inner bottom surface of the base plate 361 of the cover structure 36 (e.g., the metal lid structure). The external connecting elements 38 (e.g., solder bumps) are disposed adjacent to the second surface 302 of the package substrate 30. The bottom portions of the external connecting elements 38 (e.g., solder bumps) are disposed in the openings 261 of the first protection layer 26 so that the circuit layer of the package substrate 30 is electrically connected to the circuit layer of the main body 24 of the main substrate 2.

The heat pipe 4 contacts the cover structure 36 (e.g., the metal lid structure) for dissipating a heat generated by the semiconductor die 32. The heat pipe 4 is an enclosed hollow structure, and may include a wick structure on the inner surface of the wall of the heat pipe 4. There may be a working liquid 43 in the heat pipe 4. A material of the working fluid 43 may be water, ethanol, acetone, isopropanol, chlorofluorocarbon (CFC) or other suitable material. In one embodiment, the heat pipe 4 is a U-shaped heat pipe, and includes one first portion 41 and two second portions 42. The first portion 41 connects the two second portions 42. The heat pipe 4 is formed integrally. The first portion 41 is disposed adjacent to the cover structure 36 (e.g., the metal lid structure), and the second portion 42 is disposed adjacent to the main substrate 2. As shown in FIG. 2, the first portion 41 is disposed on and contacts the top surface of the base plate 361 of the cover structure 36 (e.g., the metal lid structure). The two second portions 42 penetrate through the main substrate 2. That is, a portion of the end portion 421 of the second portion 42 is disposed in the through hole 23 of the main substrate 2. The end portion 421 of the second portion 42 may protrude from the second surface 22 of the main substrate 2. In addition, a solder material 44 may be applied to the end portion 421 of the second portion 42 and the second surface 22 of the main substrate 2 so as to fix the end portion 421 of the second portion 42 of the heat pipe 4 to the main substrate 2.

As shown in FIG. 2, during the operation of the semiconductor die 32, the heat generated by the semiconductor die 32 will be absorbed by the cover structure 36 (e.g., the metal lid structure) so as to obtain an even temperature distribution. Then, the heat of the cover structure 36 (e.g., the metal lid structure) will be absorbed by the first portion 41 of the heat pipe 4 and transferred or conducted to the end portion 421 of the second portion 42 of the heat pipe 4. Then, the heat of the end portion 421 of the second portion 42 of the heat pipe 4 is carried out by the copper layer of the main substrate 2 or other heat dissipation device. Since the first portion 41 of the heat pipe 4 is very close to the first surface 321 of the semiconductor die 32, the heat dissipation efficiency is relatively high. In addition, the first portion 41 of the heat pipe 4 can be positioned to be near to or right above the hot spot of the semiconductor package structure 3 so as to increase the heat dissipation efficiency.

Figure 3:
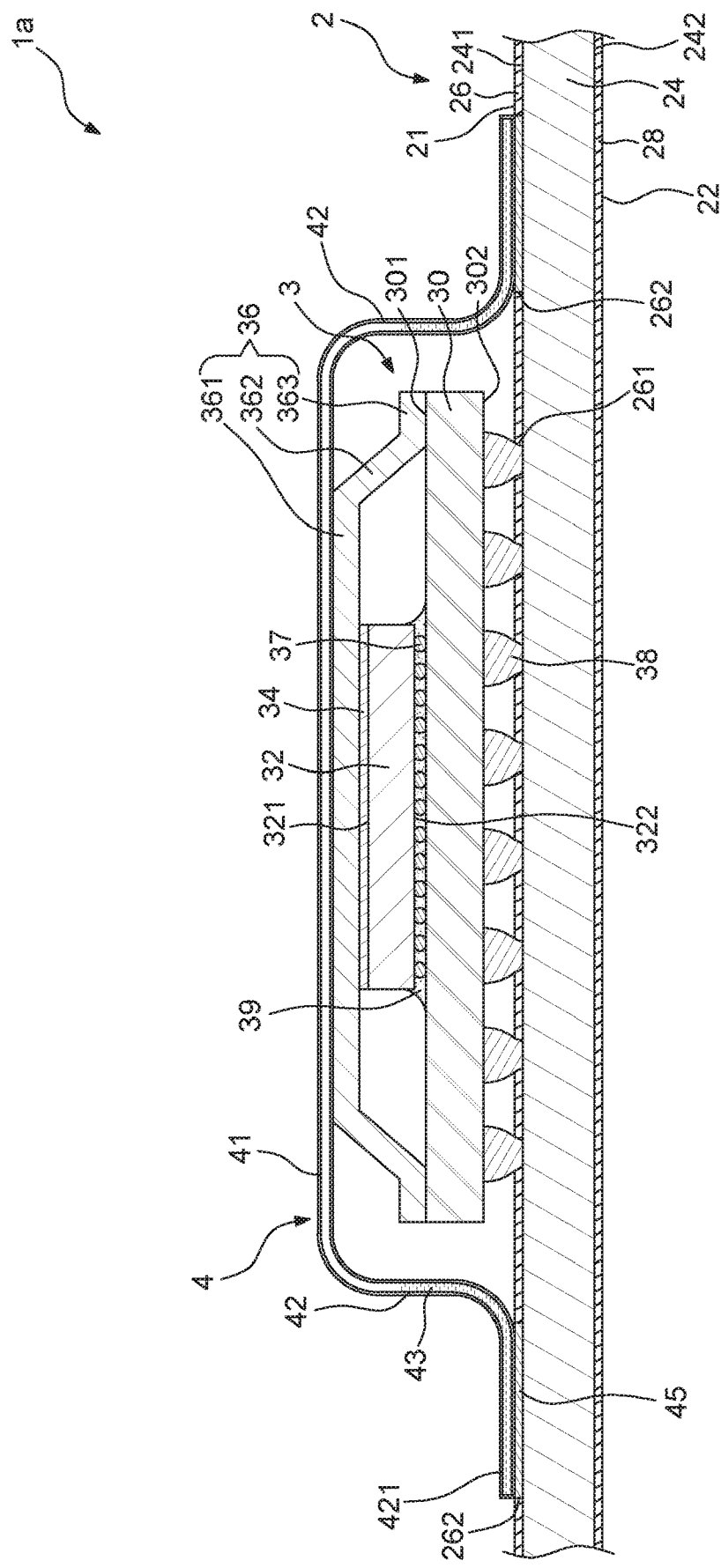
FIG. 3 illustrates an assembled cross-sectional view of an electronic device according to some embodiments of the present disclosure.

FIG. 3 illustrates an assembled cross-sectional view of an electronic device 1a according to some embodiments of the present disclosure. The electronic device 1a is similar to the electronic device 1 of FIG. 1 and FIG. 2, and the differences are described as follows. The end portion 421 of the second portion 42 of the heat pipe 4 is a horizontal segment disposed on the first surface 21 of the main substrate 2. The end portion 421 of the second portion 42 of the heat pipe 4 is parallel with and disposed on the first surface 21 of the main substrate 2. In addition, the end portion 421 of the second portion 42 of the heat pipe 4 is thermally connected and physically connected to the main body 24 of the main substrate 2 through the solder material 45 in the opening 262 of the first protection layer 26.

Figure 4:
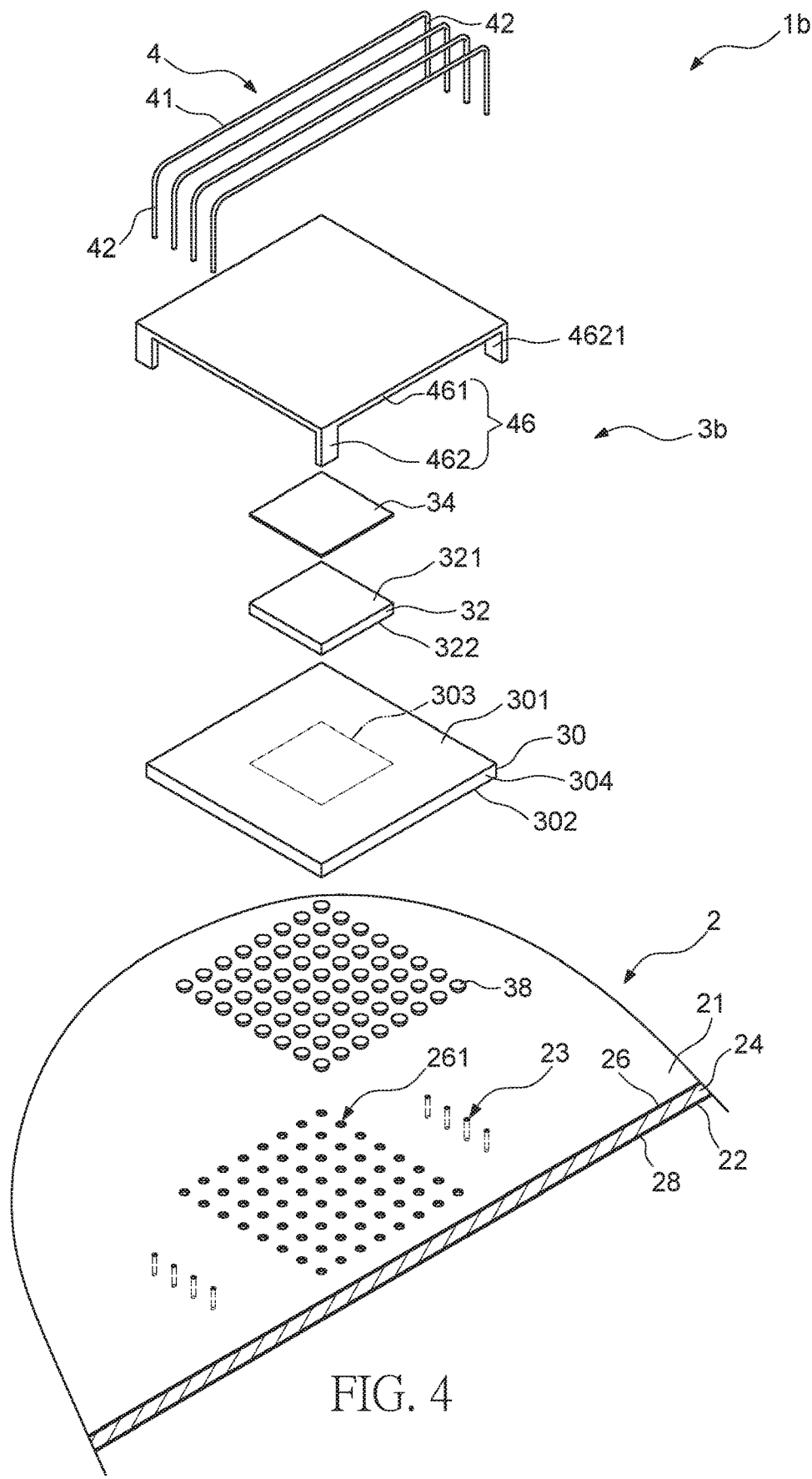
FIG. 4 illustrates an exploded perspective view of an electronic device according to some embodiments of the present disclosure.
Figure 5:
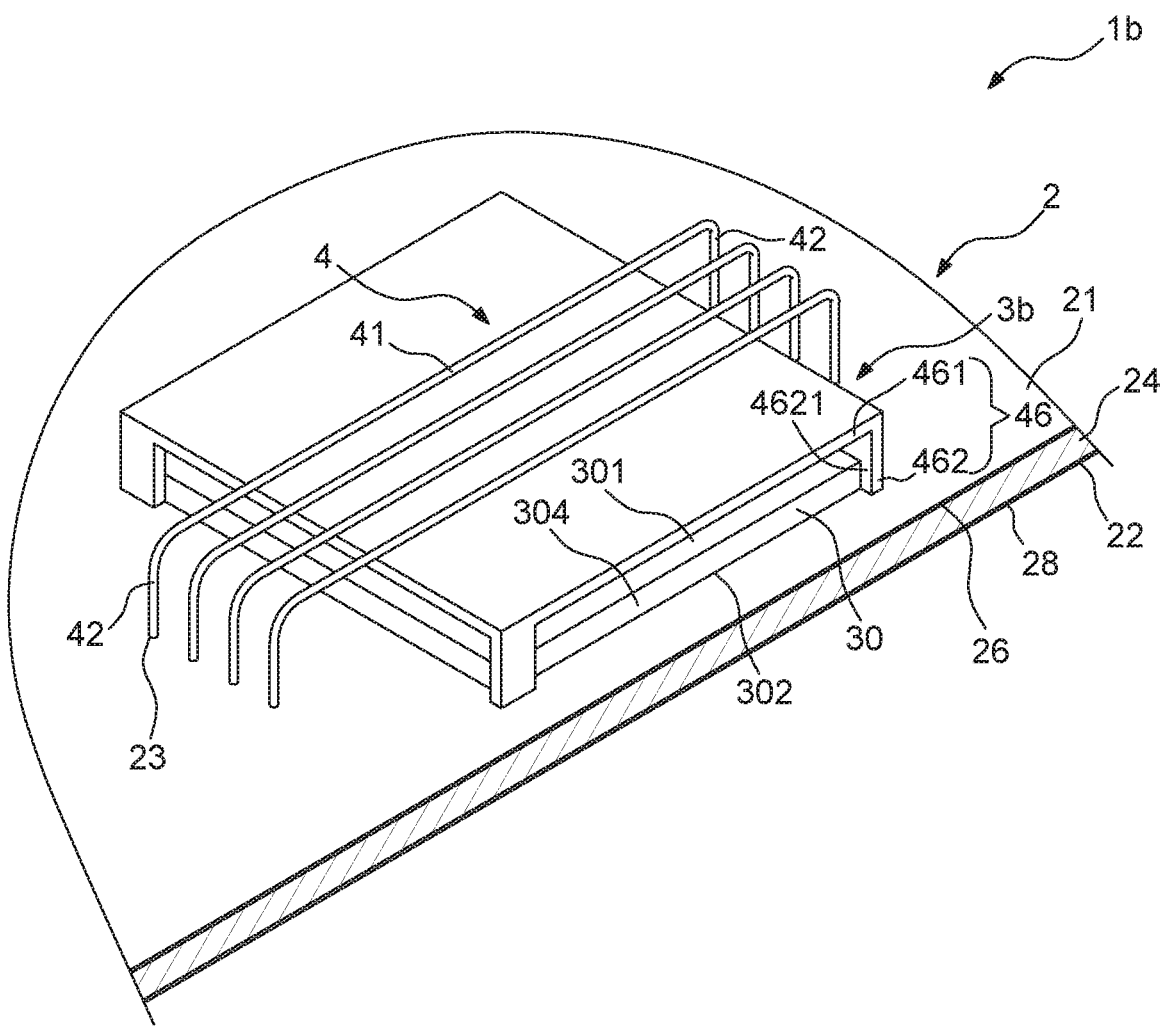
FIG. 5 illustrates an assembled perspective view of the electronic device of FIG. 4.
Figure 6:
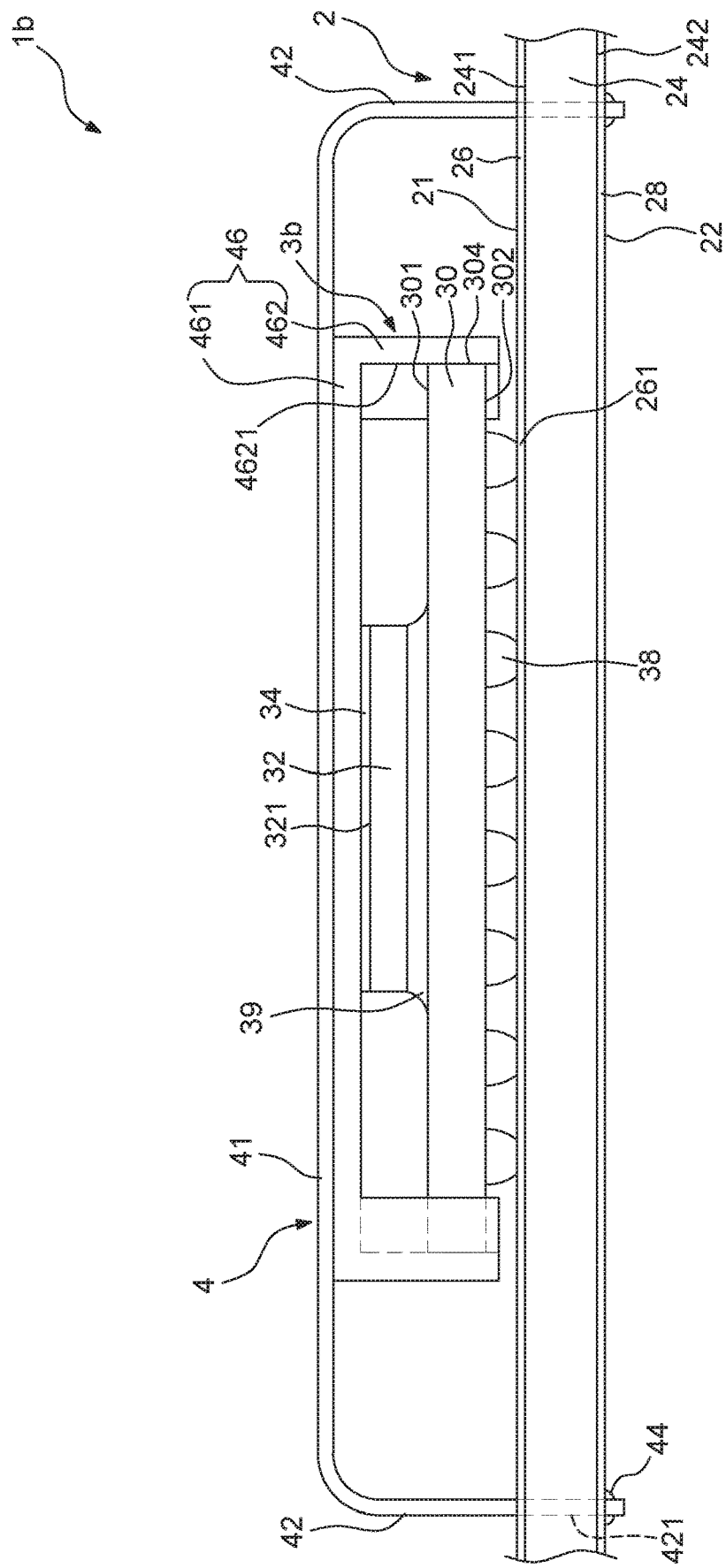
FIG. 6 illustrates a front view of the electronic device of FIG. 5.
Figure 7:
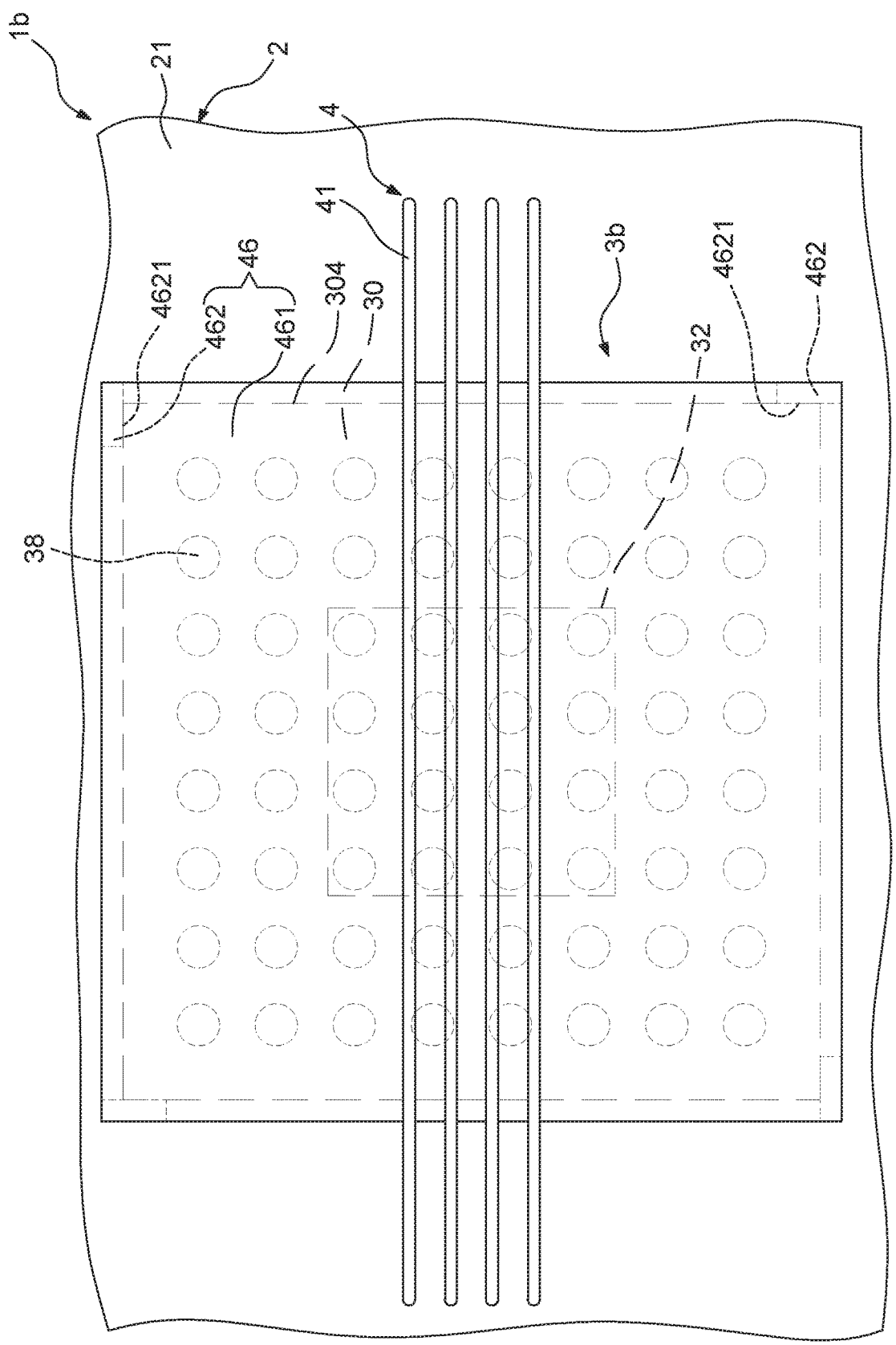
FIG. 7 illustrates a top view of the electronic device of FIG. 5.

FIG. 4 illustrates an exploded perspective view of an electronic device 1b according to some embodiments of the present disclosure. FIG. 5 illustrates an assembled perspective view of the electronic device 1b of FIG. 4. FIG. 6 illustrates a front view of the electronic device 1b of FIG. 5. FIG. 7 illustrates a top view of the electronic device 1b of FIG. 5. The electronic device 1b is similar to the electronic device 1 of FIG. 1 and FIG. 2, and the differences are described as follows. The cover structure 46 (e.g., the metal lid structure) of the semiconductor package structure 3b includes a base plate 461 and four position pins 462 disposed at four corners of the base plate 461. An inner surface 4621 of each of the position pins 462 contacts a portion of a lateral surface 304 of the package substrate 30. The bottom portion of the position pin 462 may not attached to or contact the first surface 241 of the main substrate 24. That is, there may be a gap between the bottom portion of the position pin 462 and the first surface 241 of the main substrate 24.

The thermal adhesive material 34 (e.g., a thermal interface material (TIM)) is interposed between the semiconductor die 32 and the cover structure 46 (e.g., the metal lid structure). That is, the thermal adhesive material 34 (e.g., a thermal interface material (TIM) is used to adhere the first surface 321 of the semiconductor die 32 to the inner bottom surface of the base plate 461 of the cover structure 46 (e.g., the metal lid structure). The heat pipe 4 contacts the cover structure 46 (e.g., the metal lid structure) for dissipating a heat generated by the semiconductor die 32. In one embodiment, the heat pipe 4 is a U-shaped heat pipe, and includes one first portion 41 and two second portions 42. The first portion 41 connects the two second portions 42. As shown in FIG. 6, the first portion 41 is disposed on and contacts the top surface of the base plate 461 of the cover structure 46 (e.g., the metal lid structure). The two second portions 42 penetrate through the main substrate 2.

Figure 8:
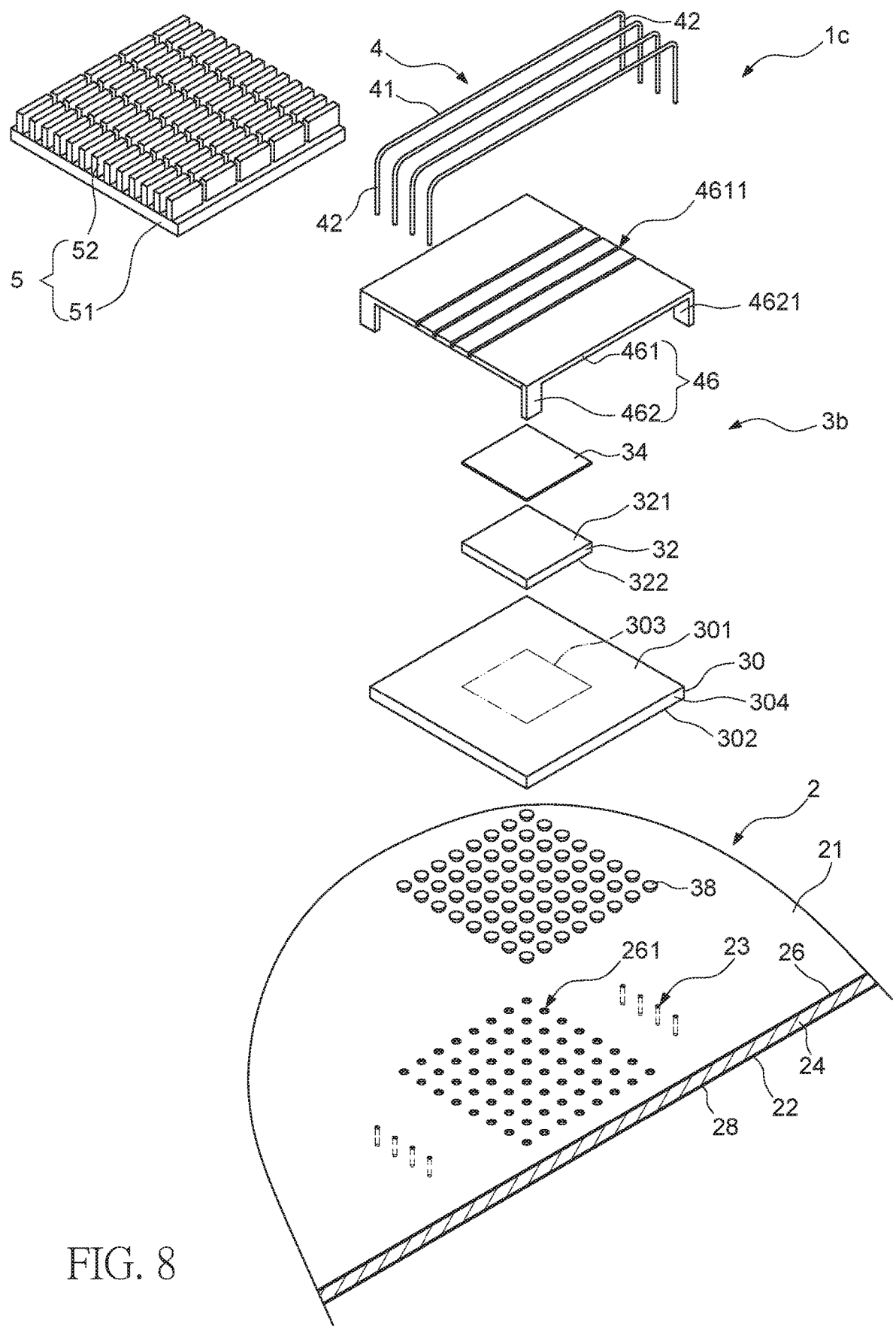
FIG. 8 illustrates an exploded perspective view of an electronic device according to some embodiments of the present disclosure.
Figure 9:
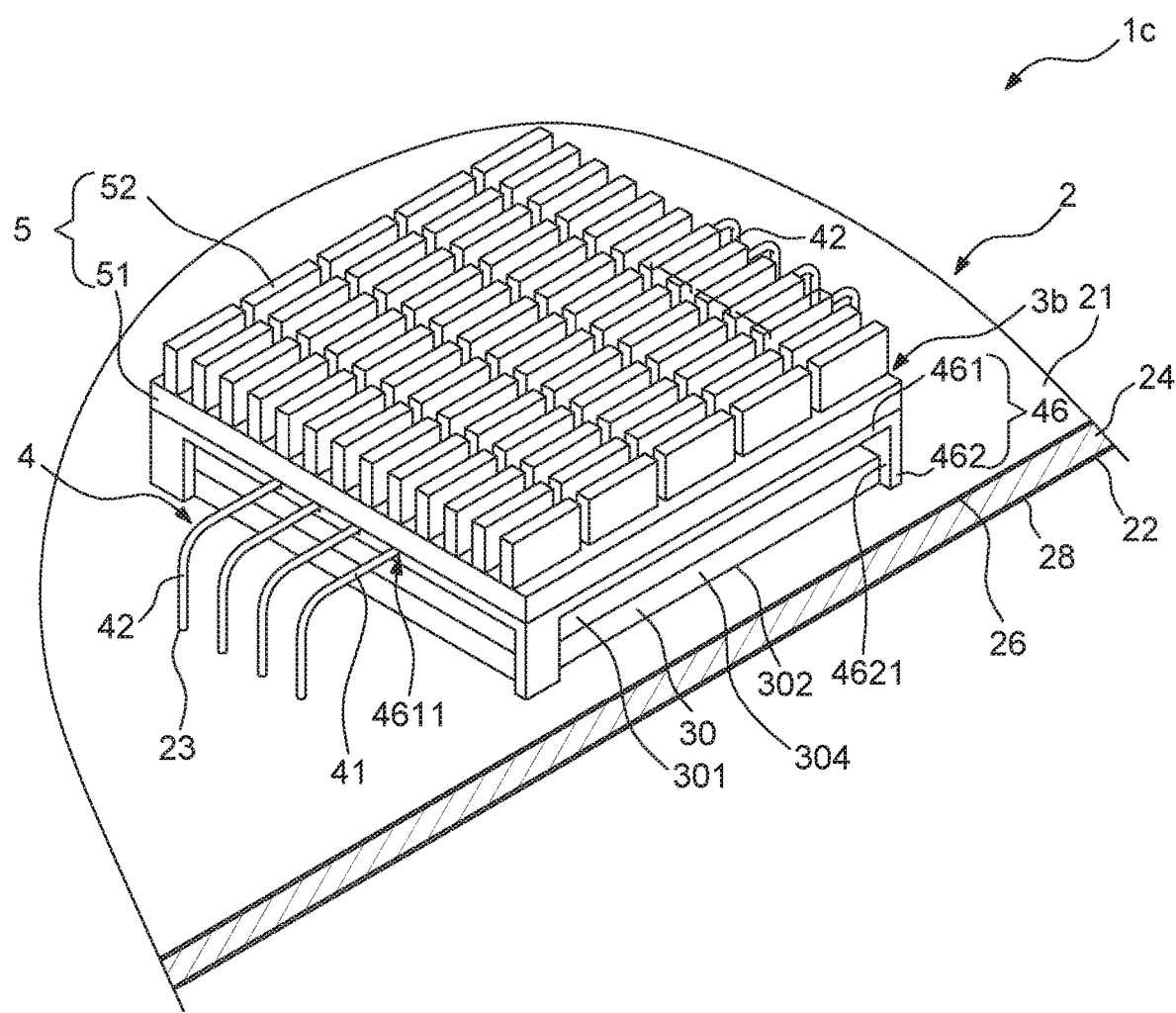
FIG. 9 illustrates an assembled perspective view of the electronic device of FIG. 8.

FIG. 8 illustrates an exploded perspective view of an electronic device 1c according to some embodiments of the present disclosure. FIG. 9 illustrates an assembled perspective view of the electronic device 1c of FIG. 8. The electronic device 1c is similar to the electronic device 1b of FIG. 4 to FIG. 7, and the differences are described as follows. The cover structure 46 (e.g., the metal lid structure) of the electronic device 1c further defines a plurality of grooves 4611 on the top surface of the base plate 461. The first portions 41 of the heat pipes 4 are disposed in the grooves 4611. In addition, the electronic device 1c further includes a heat sink 5. The heat sink 5 includes a base plate 51 and a plurality of heat dissipating fins 52 disposed on the base plate 51. The base plate 51 of the heat sink 5 may be attached to the top surface of the base plate 461 of the cover structure 46 (e.g., the metal lid structure). That is, the base plate 51 of the heat sink 5 may be disposed on and contact the first portions 41 of the heat pipes 4. In one embodiment, the depth of the groove 4611 may be substantially equal to the outer diameter of the first portion 41 of the heat pipe 4, so that the base plate 51 of the heat sink 5 may be attached to the top surface of the base plate 461 of the cover structure 46 securely. In one embodiment, the base plate 51 of the heat sink 5 is thermally connected to the first portions 41 of the heat pipes 4 so as to improve the heat dissipation efficiency. In one embodiment, a size of the base plate 51 of the heat sink 5 from a top view may be the same as a size of the base plate 461 of the cover structure 46 (e.g., the metal lid structure).

Figure 10:
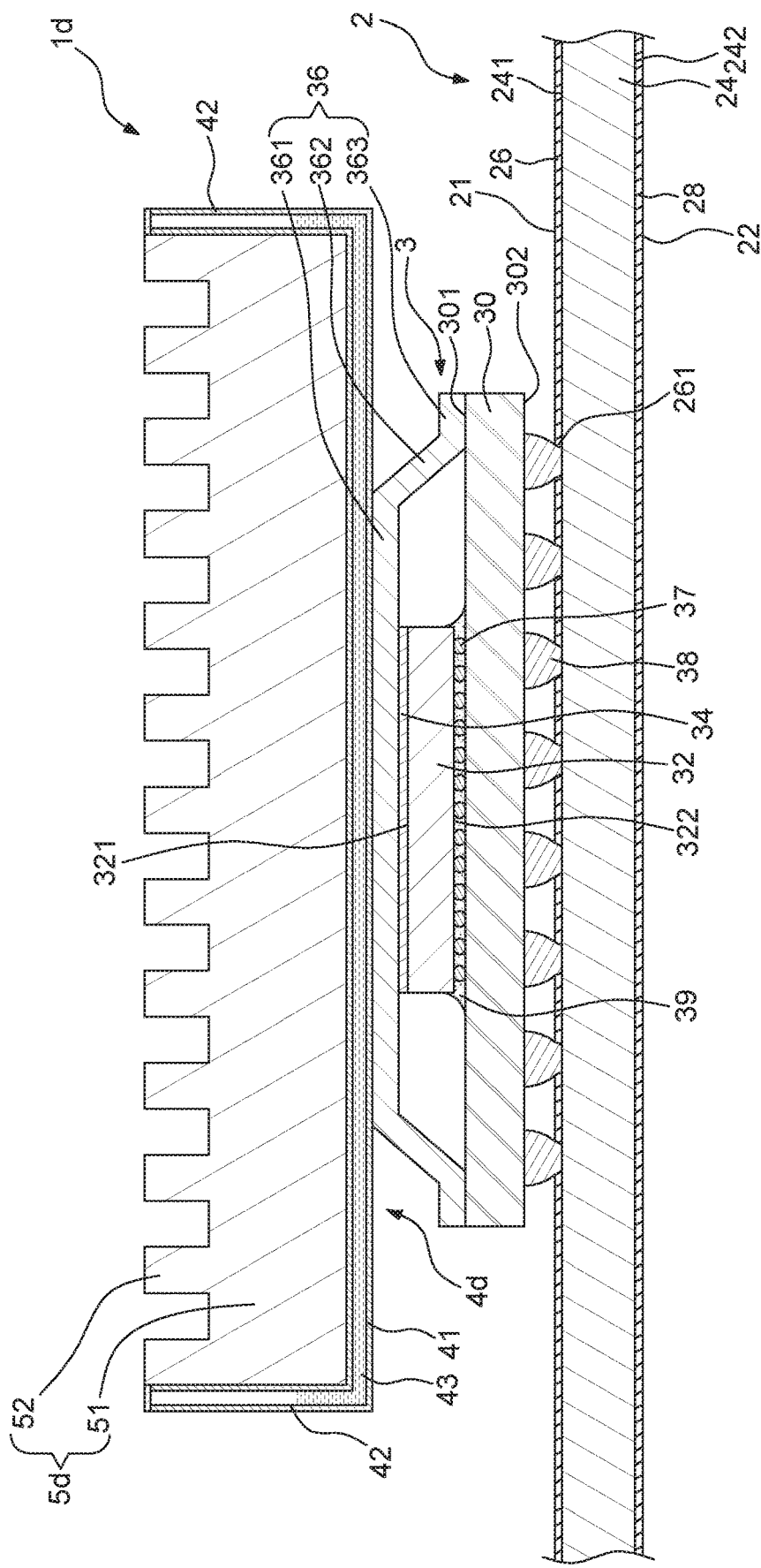
FIG. 10 illustrates a cross-sectional view of an electronic device according to some embodiments of the present disclosure.

FIG. 10 illustrates a cross-sectional view of an electronic device 1d according to some embodiments of the present disclosure. The electronic device 1d is similar to the electronic device 1 of FIG. 1 and FIG. 2, and the differences are described as follows. The second portions 42 of the heat pipes 4 of the electronic device 1d extend upwardly. The second portion 42 may be substantially perpendicular to the first portion 41. In addition, the electronic device 1d further includes a heat sink 5d. The heat sink 5d includes a base plate 51 and a plurality of heat dissipating fins 52 disposed on the base plate 51. The base plate 51 of the heat sink 5d may be attached to the top surface of the base plate 361 of the cover structure 36 (e.g., the metal lid structure). That is, the base plate 51 of the heat sink 5d may be disposed on the first portions 41 of the heat pipes 4 and between the second portions 42 of the heat pipes 4.

In one embodiment, the second portions 42 of the heat pipes 4 may contact the side surface of the heat sink 5d. That is, the second portion 42 of the heat pipe 4 is connected to the heat sink 5d. In one embodiment, the cover structure 36 (e.g., the metal lid structure) of the electronic device 1d may further define a plurality of grooves on the top surface of the base plate 361, and the first portions 41 of the heat pipes 4 are disposed in the grooves. In one embodiment, the depth of the groove may be substantially equal to the outer diameter of the first portion 41 of the heat pipe 4, so that the base plate 51 of the heat sink 5d may be attached to the top surface of the base plate 361 of the cover structure 36 securely. It is noted that the grooves of the base plate 361 may be omitted. In one embodiment, the base plate 51 of the heat sink 5d is thermally connected to the first portions 41 of the heat pipes 4 so as to improve the heat dissipation efficiency. In one embodiment, a width of the base plate 51 of the heat sink 5d from a top view may be the same as a length of the base plate 461 of the first portion 41 of the heat pipe 4.

Figure 11:
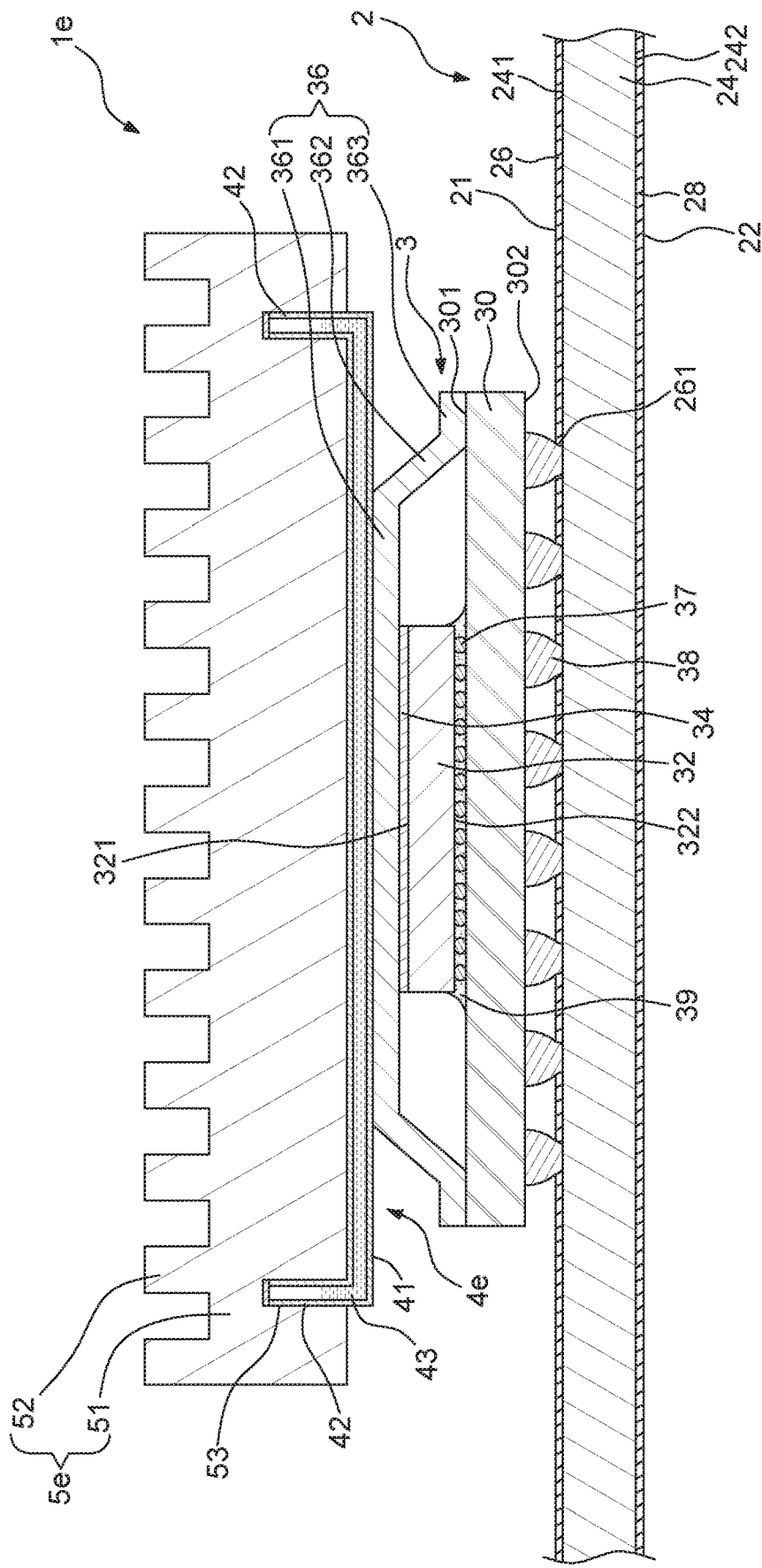
FIG. 11 illustrates a cross-sectional view of an electronic device according to some embodiments of the present disclosure.

FIG. 11 illustrates a cross-sectional view of an electronic device 1e according to some embodiments of the present disclosure. The electronic device 1e is similar to the electronic device 1d of FIG. 10, and the differences are described as follows. A width of the base plate 51 of the heat sink 5e from a top view may be greater than or equal to a width of the base plate 51 of the heat sink 5d of FIG. 10 from a top view. The heat sink 5e further defines a plurality of position holes 53 recessed from the bottom surface of the base plate 51. Each of the second portions 42 of the heat pipes 4e of the electronic device 1e is inserted into each of the position holes 53. A length of the second portion 42 of the heat pipe 4e may be substantially equal to a depth of the position hole 53.

Figure 12:
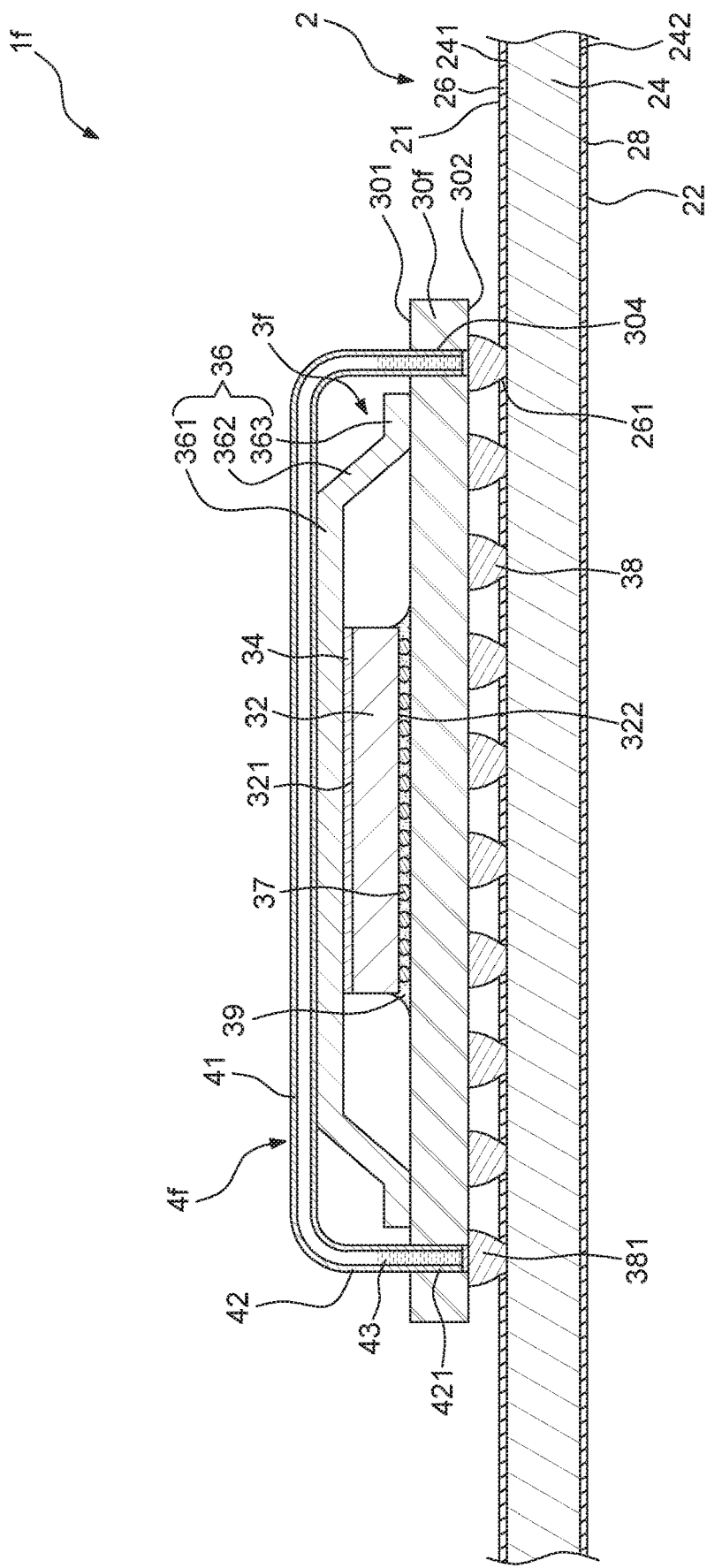
FIG. 12 illustrates a cross-sectional view of an electronic device according to some embodiments of the present disclosure.

FIG. 12 illustrates a cross-sectional view of an electronic device 1f according to some embodiments of the present disclosure. The electronic device 1f is similar to the electronic device 1 of FIG. 1 and FIG. 2, and the differences are described as follows. The package substrate 30f of the semiconductor package structure 3f defines a plurality of through holes 304. The two second portions 42 of the heat pipe 4f penetrate through the package substrate 30f. That is, a portion of the end portion 421 of the second portion 42 is disposed in the through hole 304 of the package substrate 30f. The end portion 421 of the second portion 42 may be connected to a thermal external connecting element 381. Thus, the heat of the end portion 421 of the second portion 42 may be conducted to the main substrate 2 through the thermal external connecting element 381.

Figure 13:
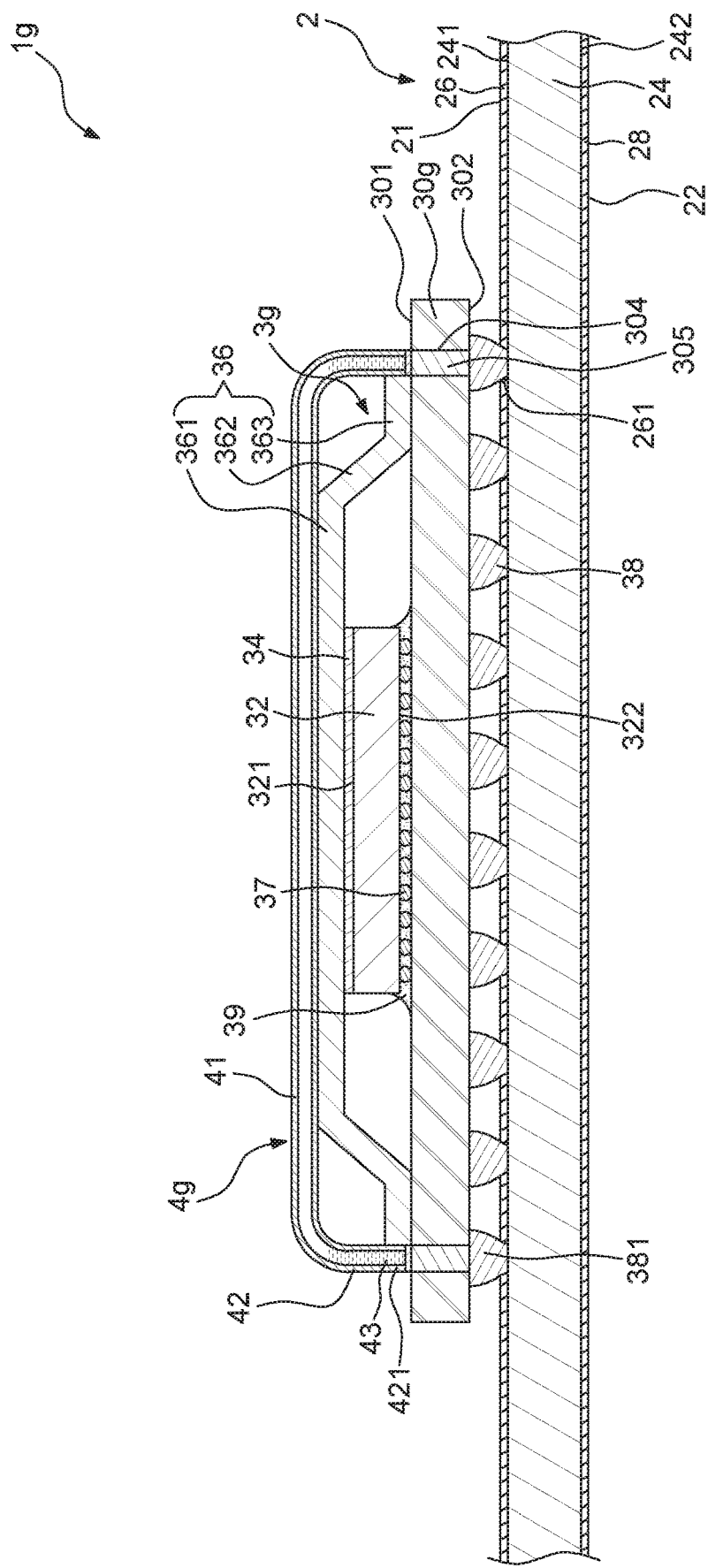
FIG. 13 illustrates a cross-sectional view of an electronic device according to some embodiments of the present disclosure.

FIG. 13 illustrates a cross-sectional view of an electronic device 1g according to some embodiments of the present disclosure. The electronic device 1g is similar to the electronic device 1f of FIG. 12, and the differences are described as follows. A conductive material is filled in the through holes 304 of the package substrate 30g of the semiconductor package structure 3g so as to form a thermal via 305. The end portion 421 of the second portion 42 of the heat pipe 4g may be thermally connected or physically connected to the thermal via 305 of the package substrate 30g. The bottom end of the thermal via 305 is connected to the thermal external connecting element 381. Thus, the heat of the end portion 421 of the second portion 42 may be conducted to the main substrate 2 through the thermal via 305 and the thermal external connecting element 381.

Figure 14:
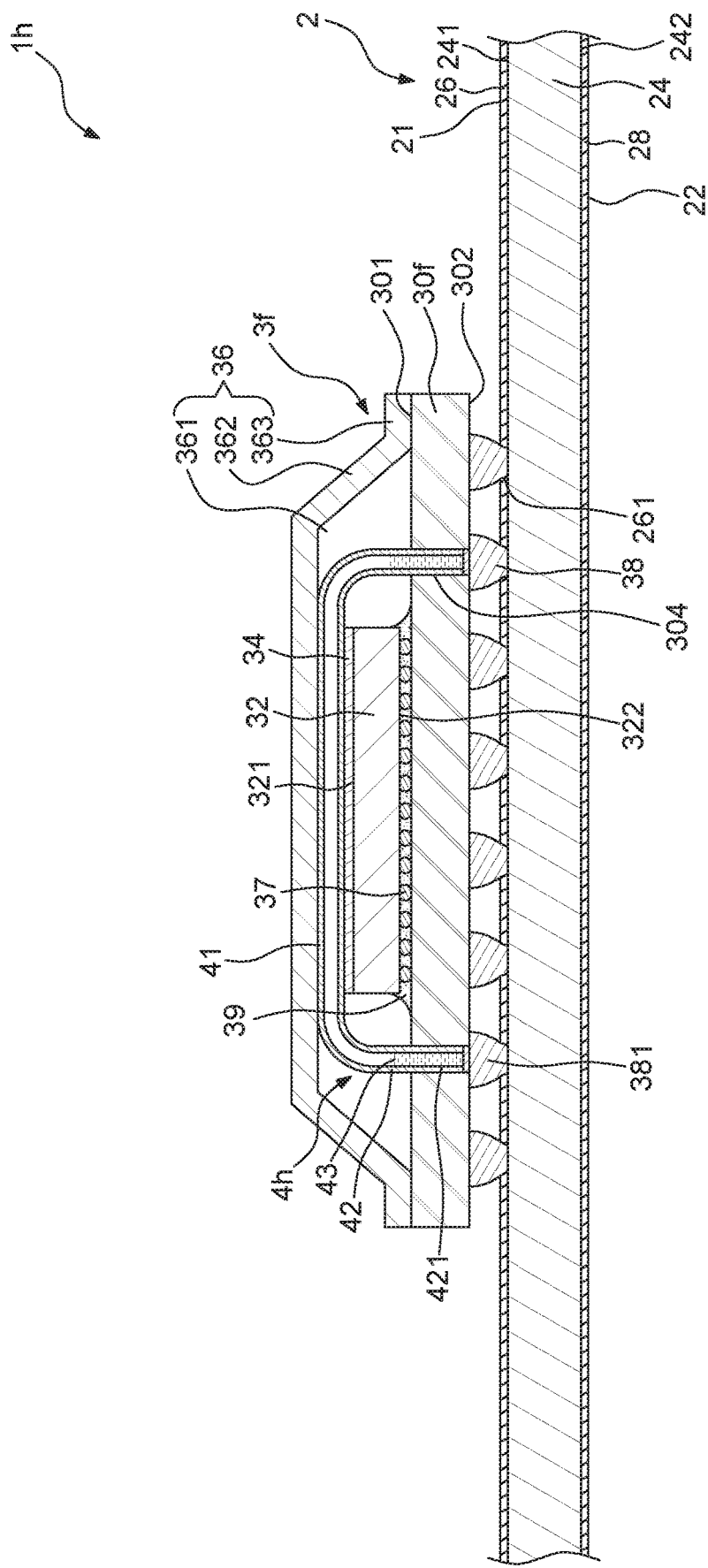
FIG. 14 illustrates a cross-sectional view of an electronic device according to some embodiments of the present disclosure.

FIG. 14 illustrates a cross-sectional view of an electronic device 1h according to some embodiments of the present disclosure. The electronic device 1h is similar to the electronic device 1f of FIG. 12, and the differences are described as follows. The heat pipe 4h is interposed between the semiconductor die 32 and the cover structure 36 (e.g., the metal lid structure). The thermal adhesive material 34 (e.g., a thermal interface material (TIM)) is used to adhere the first portion 41 of the heat pipe 4h to the first surface 321 of the semiconductor die 32. The inner bottom surface of the base plate 361 of the cover structure 36 (e.g., the metal lid structure) is thermally connected or physically connected to the first portion 41 of the heat pipe 4h.

Figure 15:
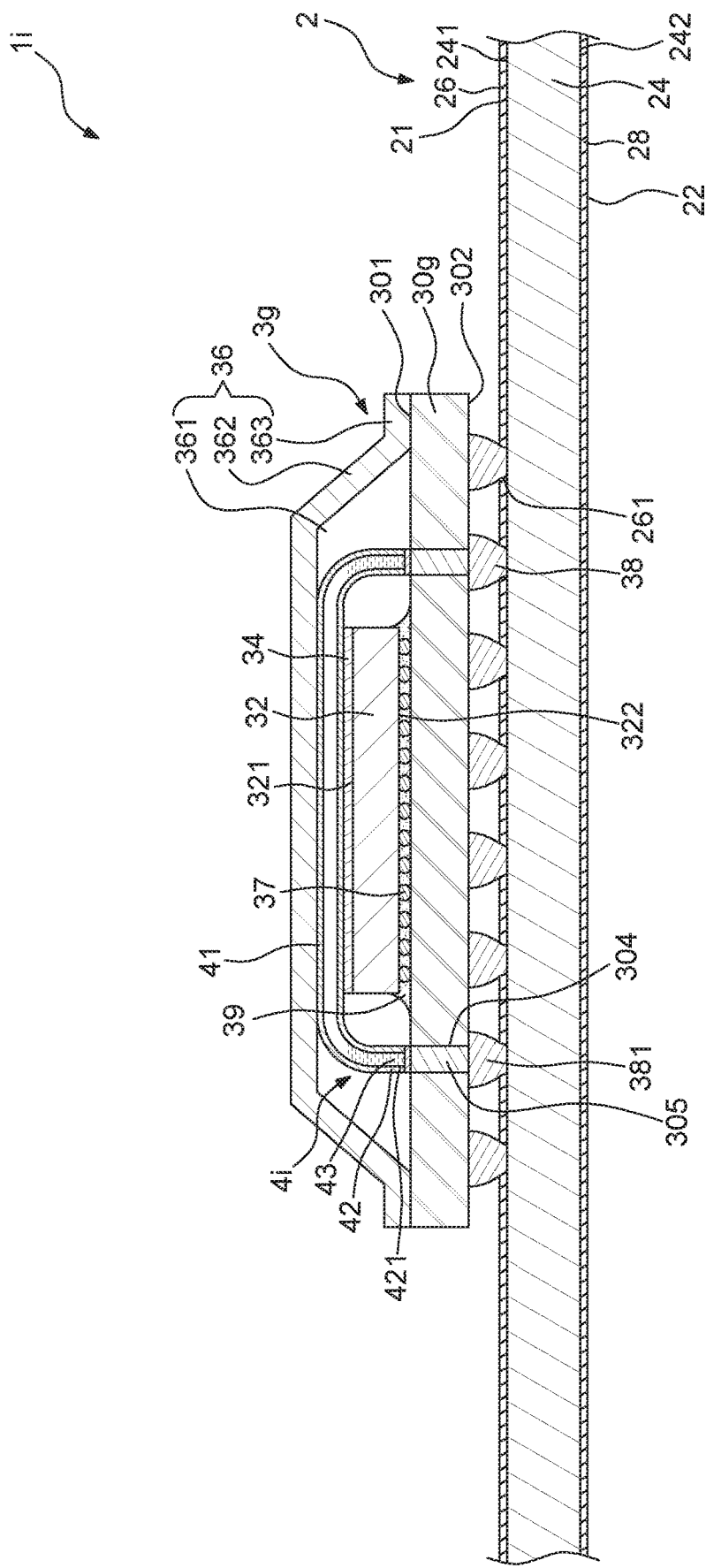
FIG. 15 illustrates a cross-sectional view of an electronic device according to some embodiments of the present disclosure.

FIG. 15 illustrates a cross-sectional view of an electronic device 1i according to some embodiments of the present disclosure. The electronic device 1i is similar to the electronic device 1g of FIG. 13, and the differences are described as follows. The heat pipe 4i is interposed between the semiconductor die 32 and the cover structure 36 (e.g., the metal lid structure). The thermal adhesive material 34 (e.g., a thermal interface material (TIM)) is used to adhere the first portion 41 of the heat pipe 4i to the first surface 321 of the semiconductor die 32. The inner bottom surface of the base plate 361 of the cover structure 36 (e.g., the metal lid structure) is thermally connected or physically connected to the first portion 41 of the heat pipe 4i.

Figure 16:
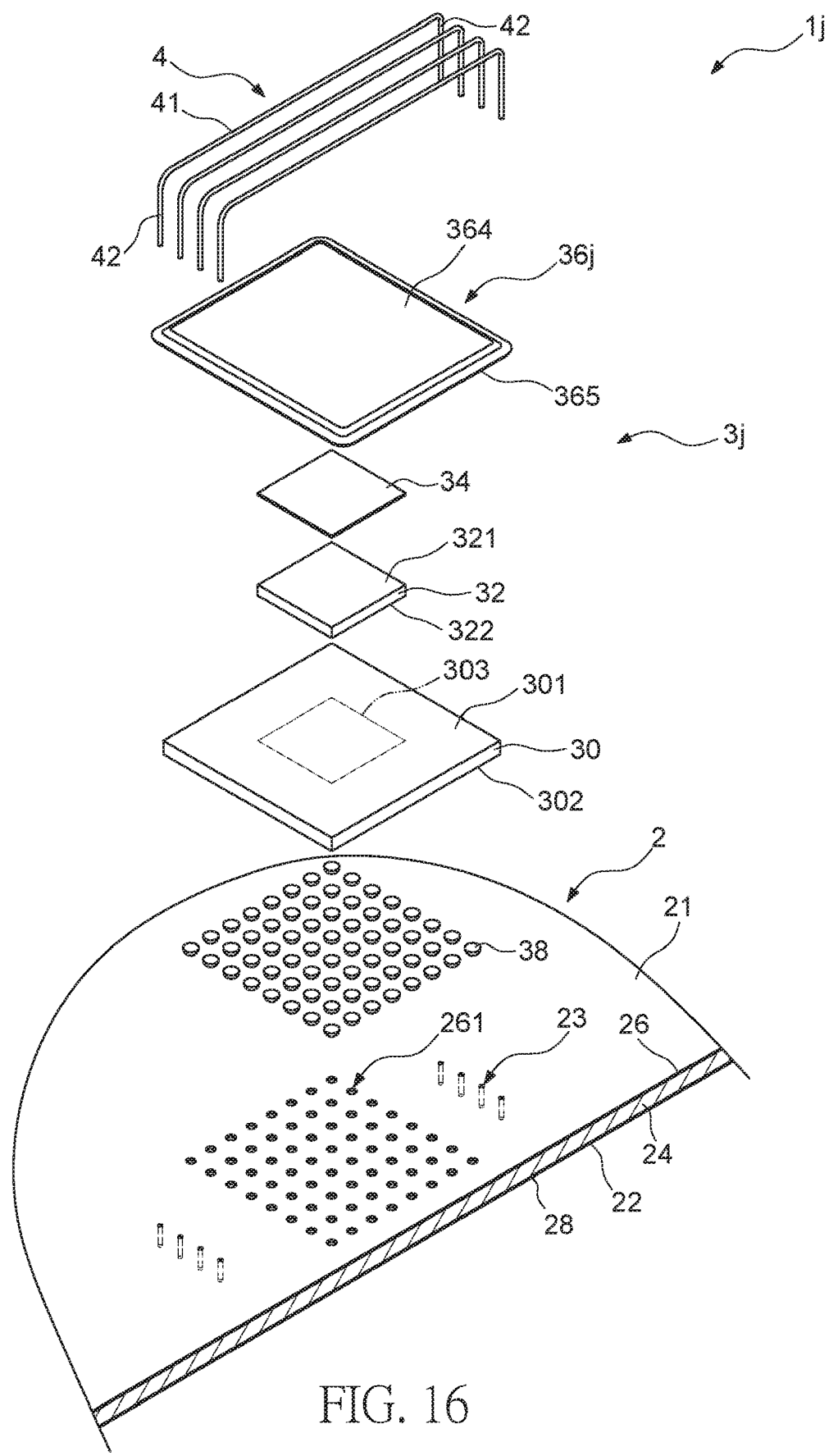
FIG. 16 illustrates an exploded perspective view of an electronic device according to some embodiments of the present disclosure.
Figure 17:
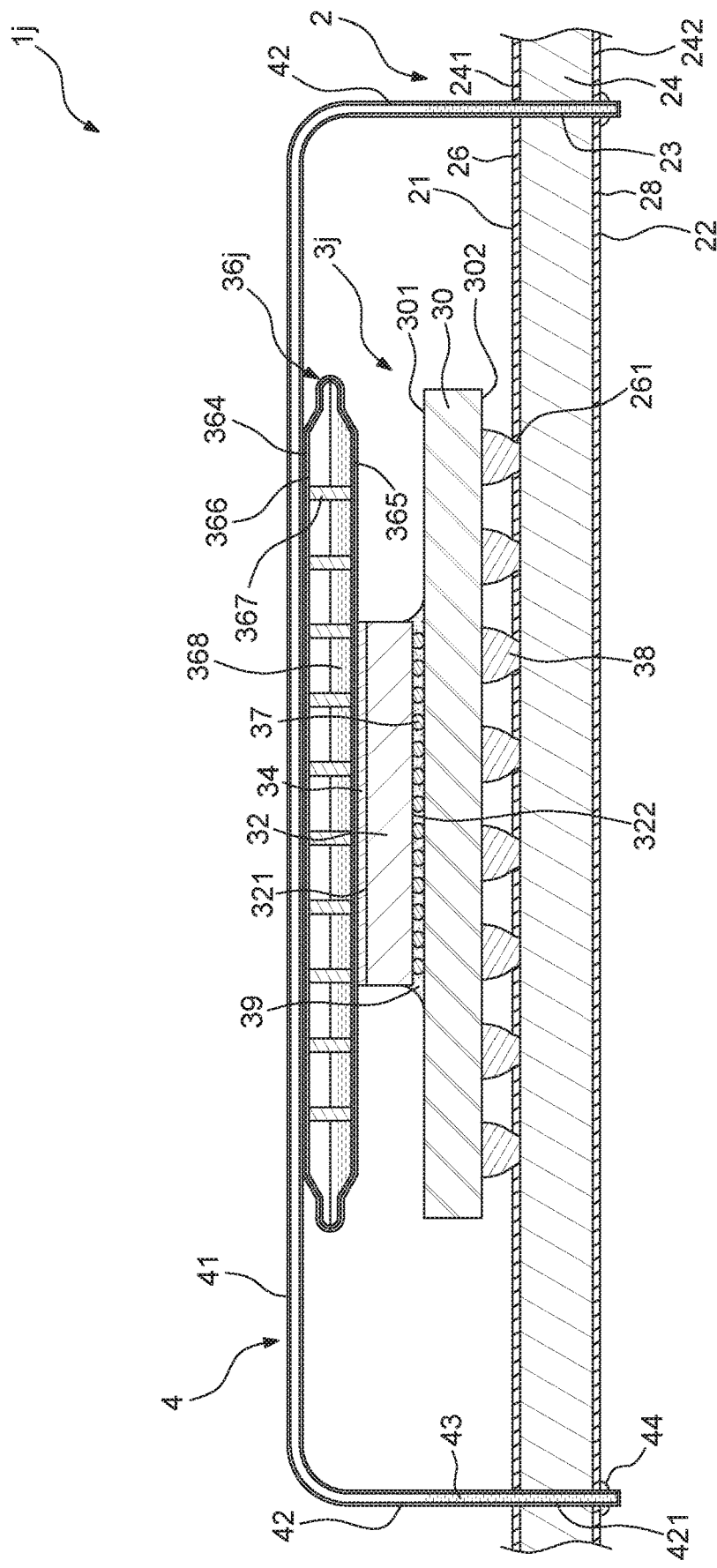
FIG. 17 illustrates a cross-sectional view of the electronic device of FIG. 16.

FIG. 16 illustrates an exploded perspective view of an electronic device 1j according to some embodiments of the present disclosure. FIG. 17 illustrates a cross-sectional view of the electronic device 1j of FIG. 16. The electronic device 1j is similar to the electronic device 1 of FIG. 1 and FIG. 2, and the differences are described as follows. The cover structure 36j of the electronic device 1j of the semiconductor package structure 3j is a vapor chamber that covers the semiconductor die 32. The cover structure 36j (e.g., the vapor chamber) includes a top wall 364, a bottom wall 365, a wick structure 366, a plurality of wick bars 367 and a working liquid 368. The top wall 364 and the bottom wall 365 are sealed together at their periphery rims to define an enclosed space (e.g., an enclosed chamber). The wick structure 366 is on the inner surfaces of the top wall 364 and the bottom wall 365. Two ends of each of the wick bars 367 connect the top wall 364 and the bottom wall 365 respectively. The working liquid 368 is disposed in the enclosed space (e.g., an enclosed chamber).

The thermal adhesive material 34 is interposed between the semiconductor die 32 and the cover structure 36j (e.g., the vapor chamber). That is, the thermal adhesive material 34 (e.g., a thermal interface material (TIM)) is used to adhere the first surface 321 of the semiconductor die 32 to the bottom surface of the bottom wall 365 of the cover structure 36j (e.g., the vapor chamber). The heat pipe 4 contacts the cover structure 36j (e.g., the vapor chamber) for dissipating a heat generated by the semiconductor die 32. The first portion 41 is disposed on and contacts the top surface of the top wall 364 of the cover structure 36j (e.g., the vapor chamber). The two second portions 42 of the heat pipe 4 penetrate through the main substrate 2.

Figure 18:
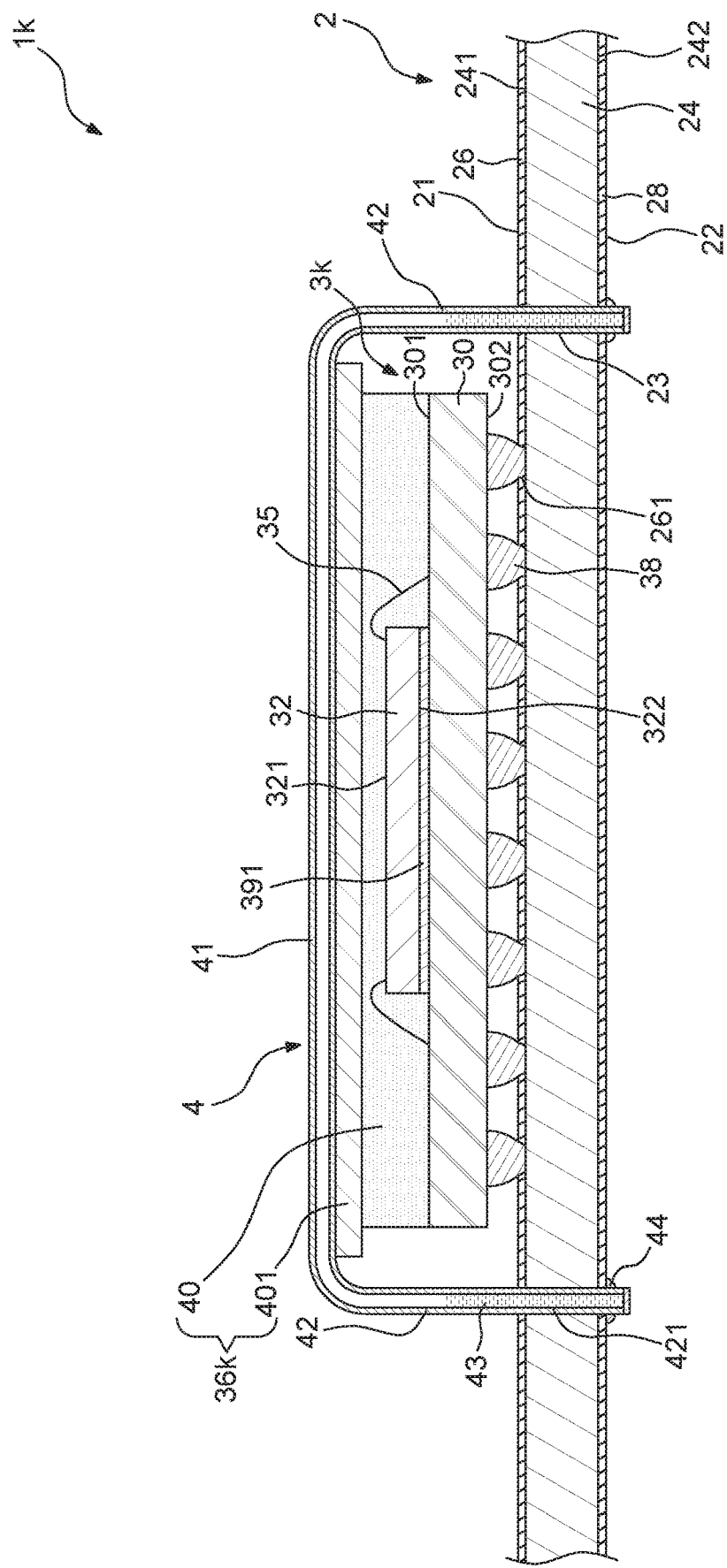
FIG. 18 illustrates a cross-sectional view of an electronic device according to some embodiments of the present disclosure.

FIG. 18 illustrates a cross-sectional view of an electronic device 1k according to some embodiments of the present disclosure. The electronic device 1k is similar to the electronic device 1 of FIG. 1 and FIG. 2, and the differences are described as follows. In the semiconductor package structure 3k of the electronic device 1k, the semiconductor die 32 is attached or adhered to the die mounting portion 303 of the package substrate 30 through a die attach adhesive 391, and is electrically connected to the package substrate 30 through a plurality of bonding wires 35. The cover structure 36k of the electronic device 1k includes a molding compound 40 and a metal plate lid 401. The molding compound 40 covers the semiconductor die 32, the bonding wires 35 and the first surface 301 of the package substrate 30. The metal plate lid 401 is disposed on the top surface of the molding compound 40. The first portion 41 of the heat pipe 4 is disposed adjacent to the molding compound 40, and the second portion 42 of the heat pipe 4 is disposed adjacent to the main substrate 2. As shown in FIG. 18, the first portion 41 is disposed on and contacts the top surface of the metal plate lid 401. The two second portions 42 penetrate through the main substrate 2.

Figure 19:
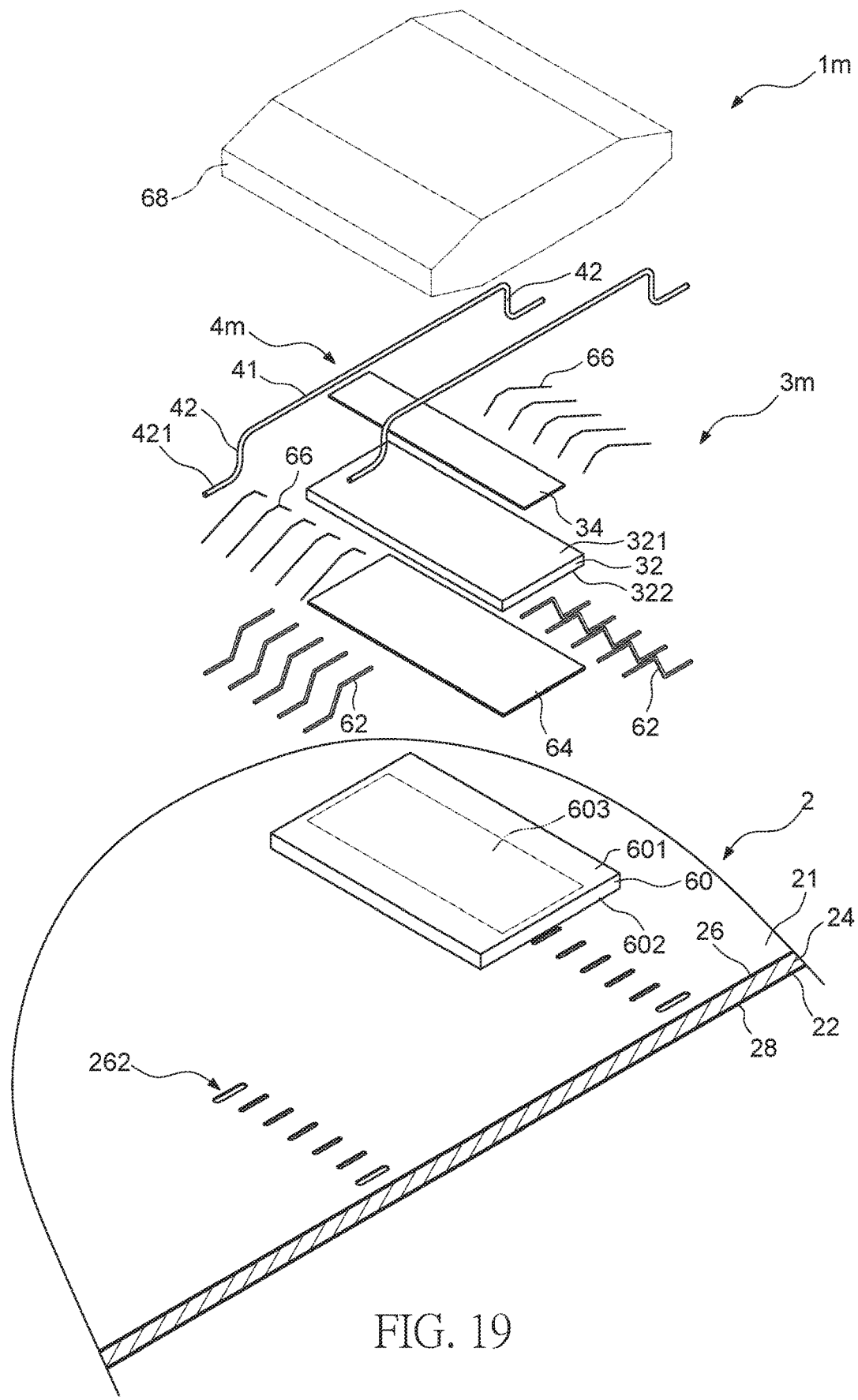
FIG. 19 illustrates an exploded perspective view of an electronic device according to some embodiments of the present disclosure.
Figure 20:
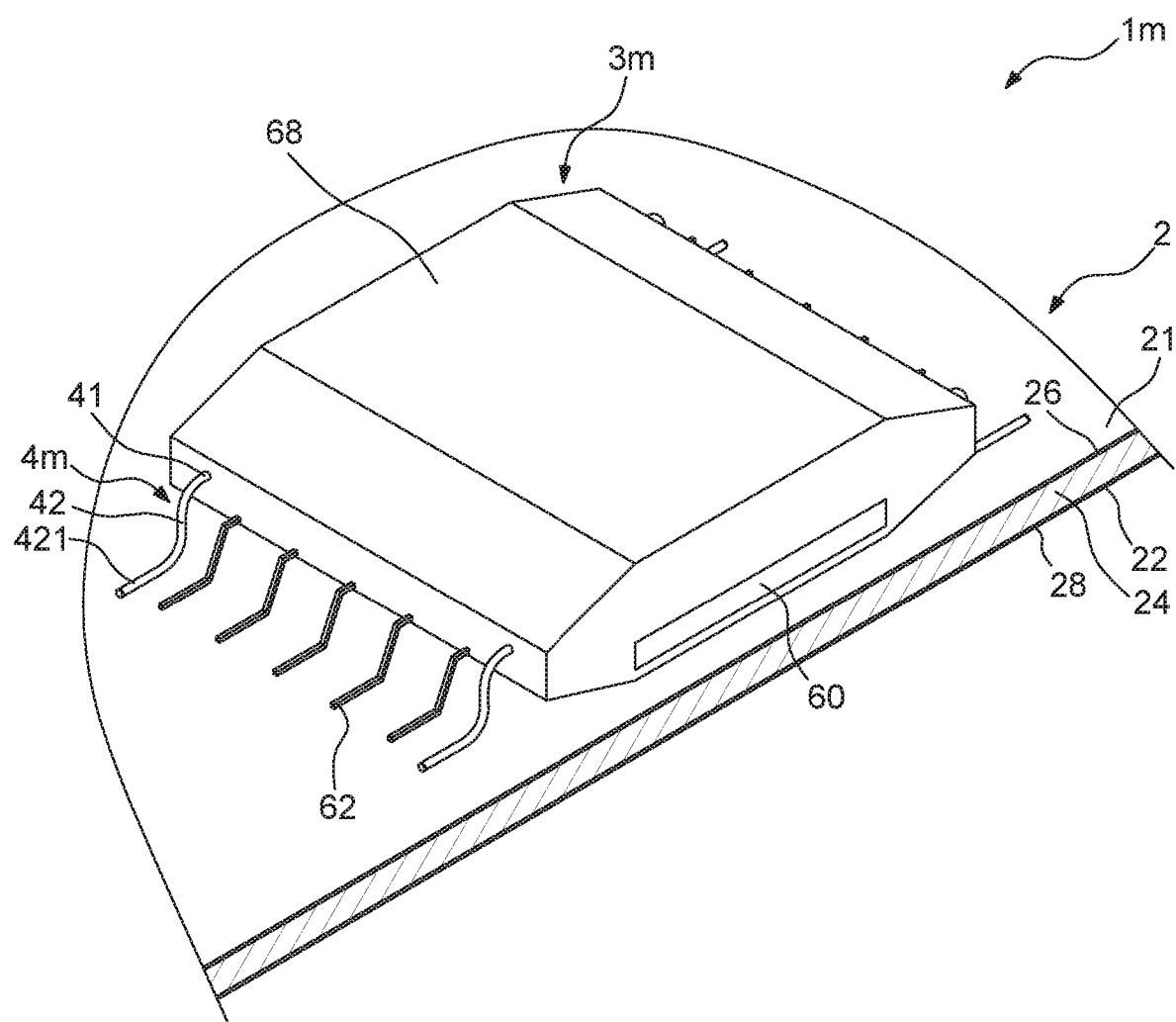
FIG. 20 illustrates an assembled perspective view of the electronic device of FIG. 19.
Figure 21:
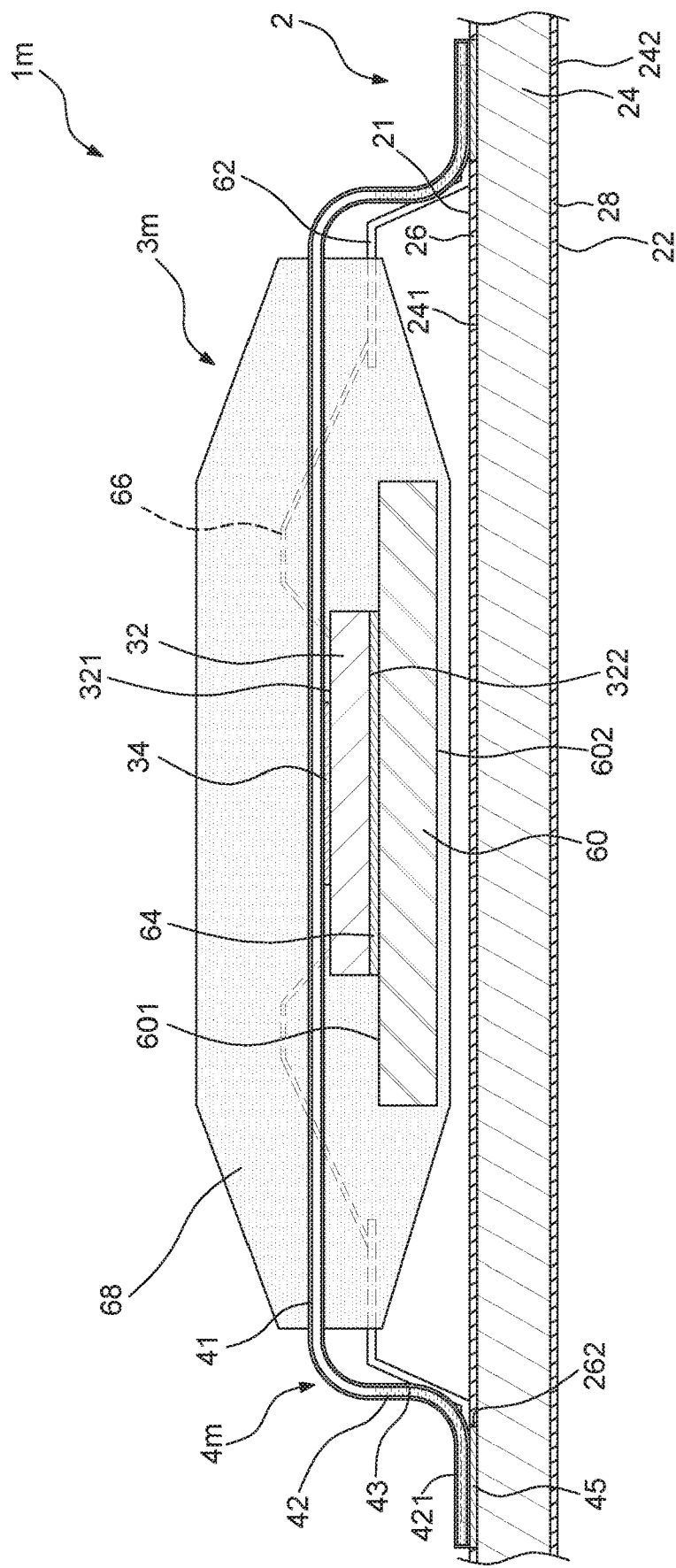
FIG. 21 illustrates a cross-sectional view of the electronic device of FIG. 20.

FIG. 19 illustrates an exploded perspective view of an electronic device 1m according to some embodiments of the present disclosure. FIG. 20 illustrates an assembled perspective view of the electronic device 1m of FIG. 19. FIG. 21 illustrates a cross-sectional view of the electronic device 1m of FIG. 20. The electronic device 1m includes a main substrate 2, semiconductor package structure 3m and at least one heat pipe 4m.

The main substrate 2 (e.g., a printed circuit board, PCB) has a first surface 21 (e.g., a top surface) and a second surface 22 (e.g., a bottom surface) opposite to the first surface 21, and includes a main body 24, a first protection layer 26, a second protection layer 28. The main body 24 has a first surface 241 (e.g., a top surface) and a second surface 242 (e.g., a bottom surface) opposite to the first surface 241. The main body 24 may include a plurality of passivation layers (not shown) and a plurality of circuit layers (not shown) interposed between the passivation layers. The first protection layer 26 and the second protection layer 28 may be solder resist layers. In addition, the first protection layer 26 may define a plurality of openings 261 extending through the first protection layer 26 to expose portions of the circuit layer of the main body 24.

The semiconductor package structure 3m may be a quad flat package (QFP), and is electrically connected to the first surface 21 of the main substrate 2. The semiconductor package structure 3m includes a die attach pad 60, a plurality of leads 62, a die attach adhesive 64, a semiconductor die 32, a thermal adhesive material 34, a plurality of bonding wires 66 and a cover structure 68. The die attach pad 60 has a first surface 601 (e.g., a top surface) and a second surface 602 (e.g., a bottom surface) opposite to the first surface 601. The die attach pad 60 may further include a die mounting portion 603 for receiving the semiconductor die 32. The leads 62 surround the die attach pad 60 and are electrically connected to the main substrate 2. The semiconductor die 32 is attached or adhered to the die mounting portion 603 of the die attach pad 60 through the die attach adhesive 64, and is electrically connected to the leads 62 through the bonding wires 66. The cover structure 68 is a molding compound that covers the semiconductor die 32, the die attach pad 60, the bonding wires 66, portions of the leads 62 and a portion of the heat pipe 4m. The first portion 41 of the heat pipe 4m is attached or adhered to the first surface 321 of the semiconductor die 32 through the thermal adhesive material 34. The end portion 421 of the second portion 42 of the heat pipe 4m is a horizontal segment disposed on the first surface 21 of the main substrate 2. The end portion 421 of the second portion 42 of the heat pipe 4m is parallel with and disposed on the first surface 21 of the main substrate 2. In addition, the end portion 421 of the second portion 42 of the heat pipe 4m is thermally connected and physically connected to the main body 24 of the main substrate 2. As shown in FIG. 19 to FIG. 21, the heat pipe 4m extends from the left side to the right side of the cover structure 68 (e.g., the molding compound). Thus, the end portions 421 of the second portion 42 of the heat pipe 4m are disposed on the left side and the right side of the cover structure 68 (e.g., the molding compound) respectively.

Figure 22:
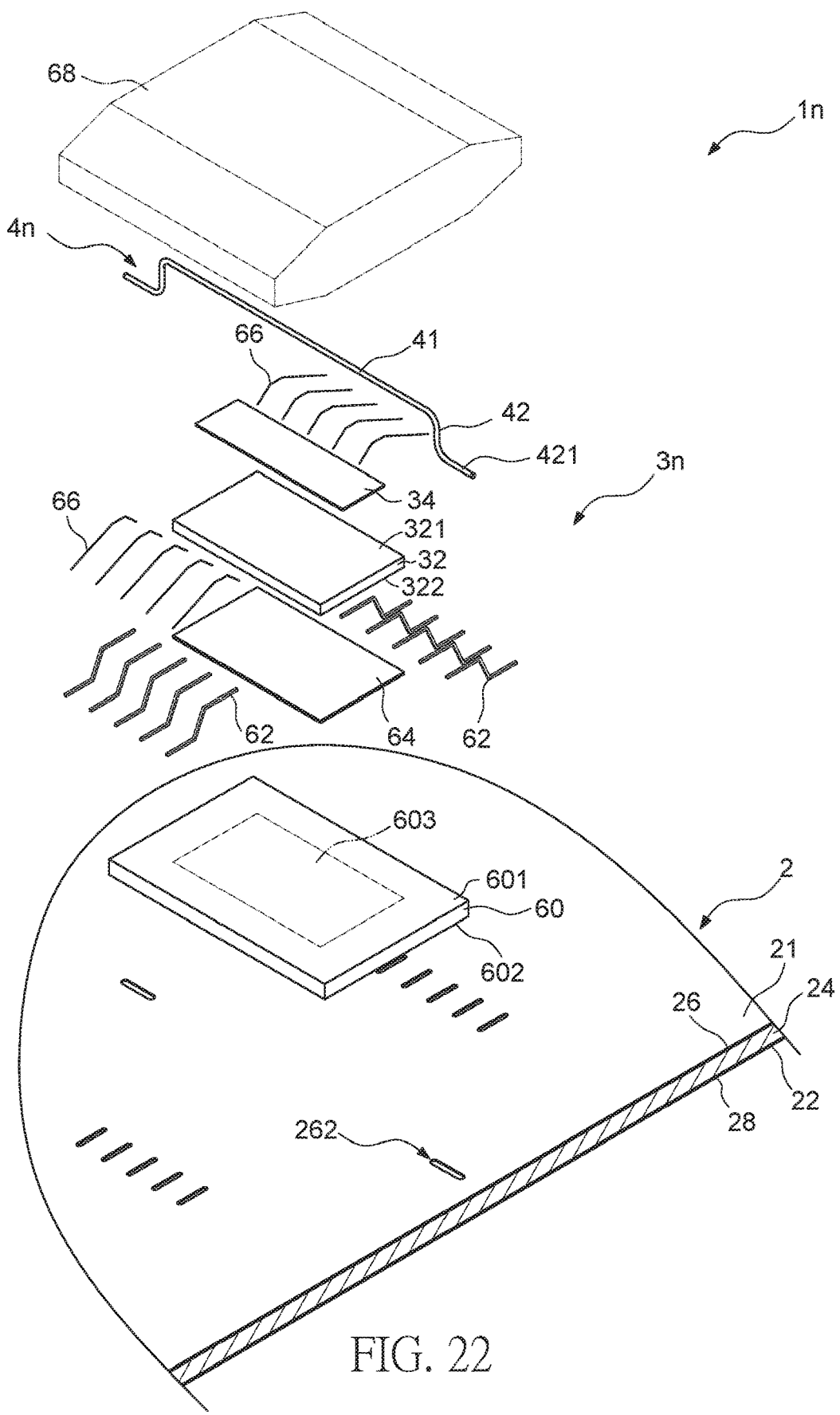
FIG. 22 illustrates an exploded perspective view of an electronic device according to some embodiments of the present disclosure.
Figure 23:
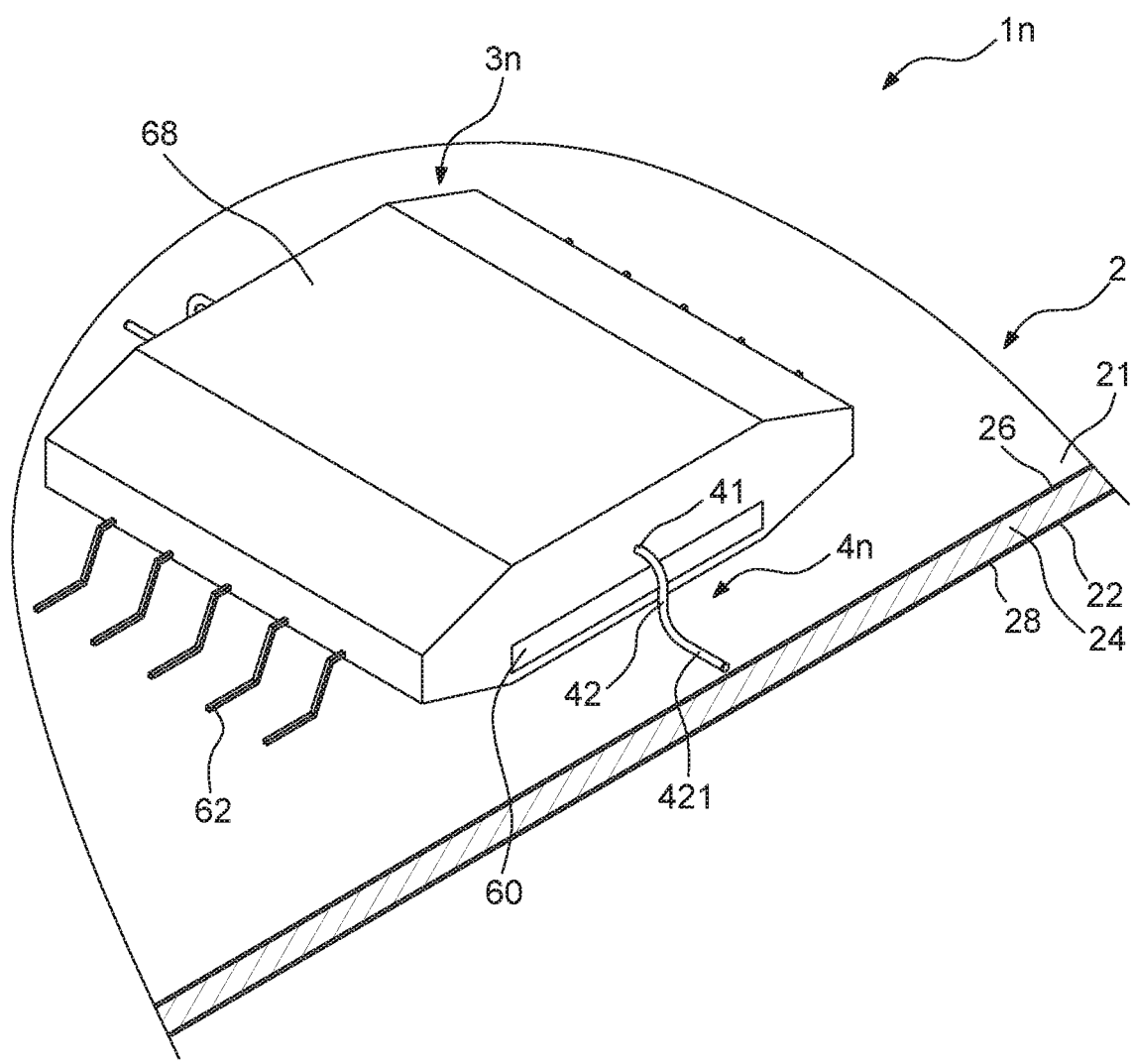
FIG. 23 illustrates an assembled perspective view of the electronic device of FIG. 22.
Figure 24:
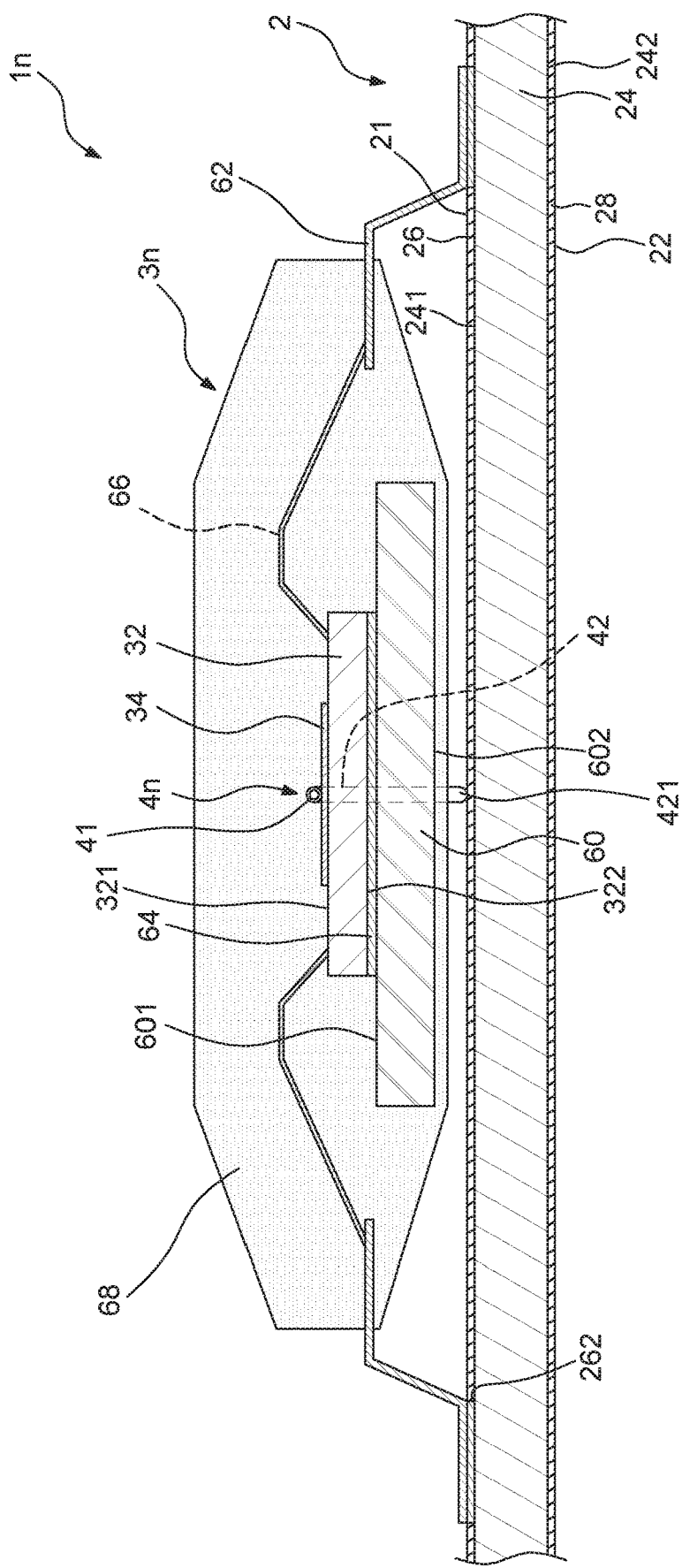
FIG. 24 illustrates a cross-sectional view of the electronic device of FIG. 23.

FIG. 22 illustrates an exploded perspective view of an electronic device 1n according to some embodiments of the present disclosure. FIG. 23 illustrates an assembled perspective view of the electronic device 1n of FIG. 22. FIG. 24 illustrates a cross-sectional view of the electronic device 1n of FIG. 23. The electronic device 1n is similar to the electronic device 1m of FIG. 19 to FIG. 21, and the differences are described as follows. In the electronic device 1n of FIG. 22 to FIG. 24, the heat pipe 4n extends from the front side to the rear side of the cover structure 68 (e.g., the molding compound). Thus, the end portions 421 of the second portion 42 of the heat pipe 4n are disposed on the front side and the rear side of the cover structure 68 (e.g., the molding compound) respectively.

Figure 25:
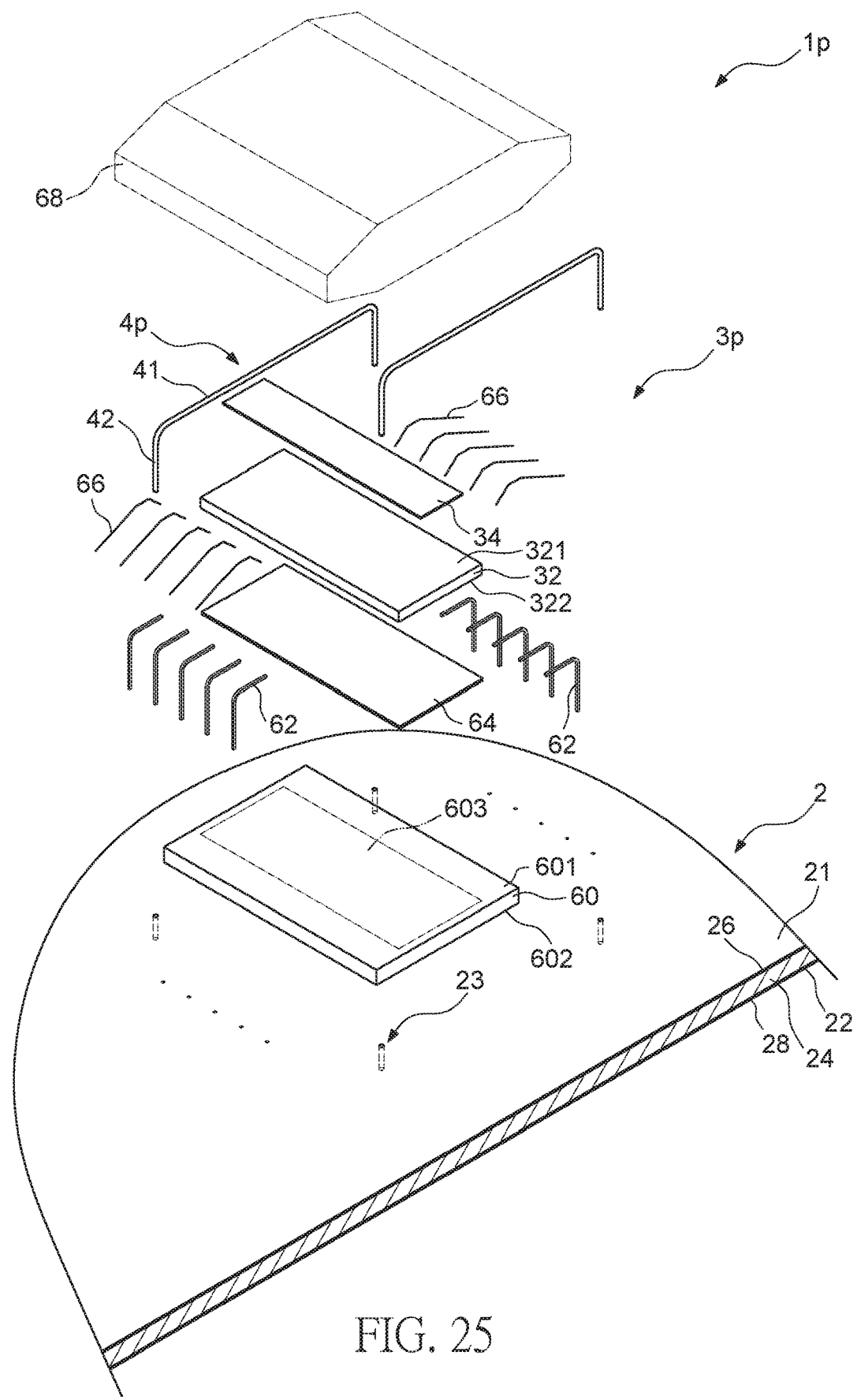
FIG. 25 illustrates an exploded perspective view of an electronic device according to some embodiments of the present disclosure.
Figure 26:
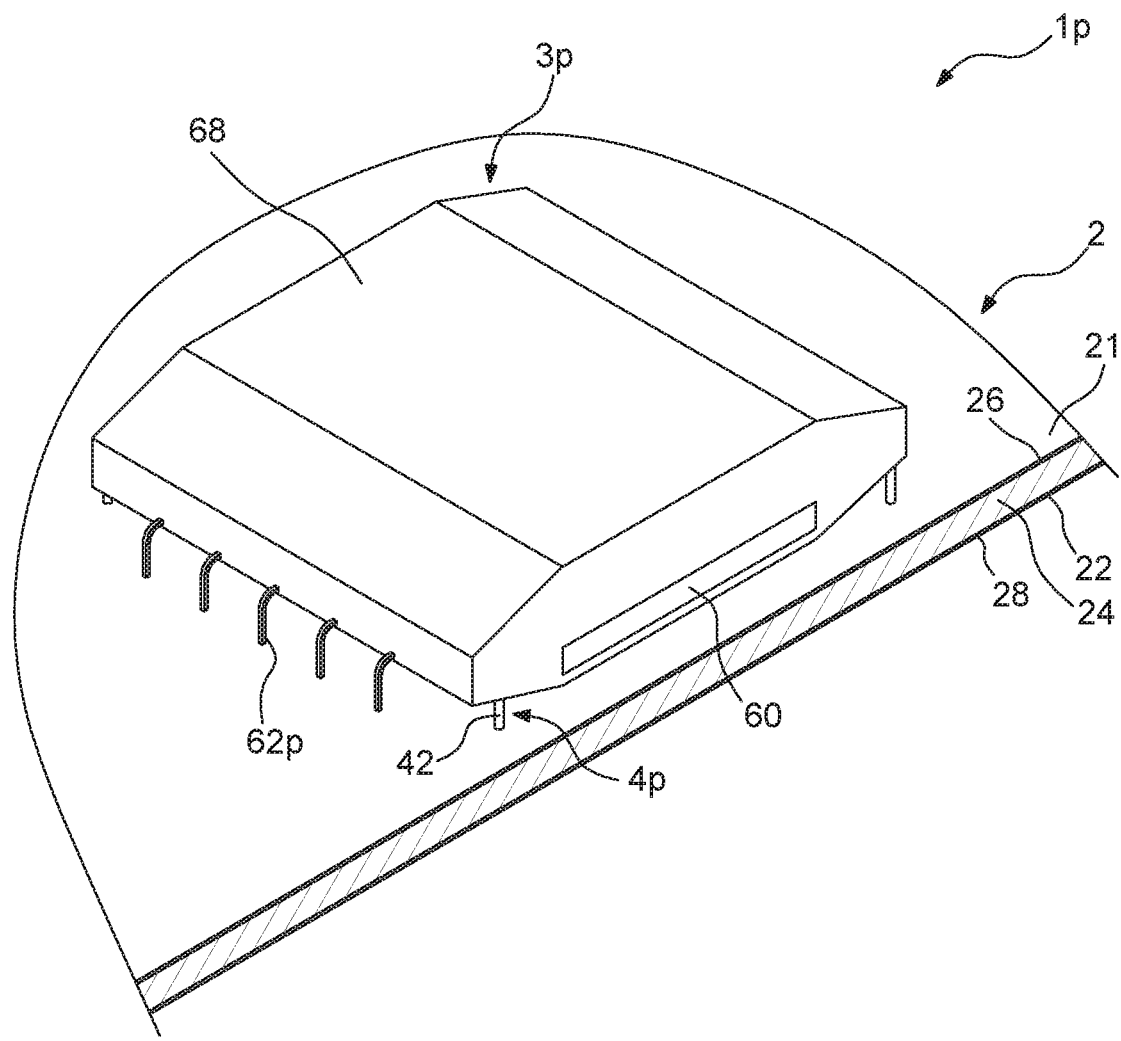
FIG. 26 illustrates an assembled perspective view of the electronic device of FIG. 25.
Figure 27:
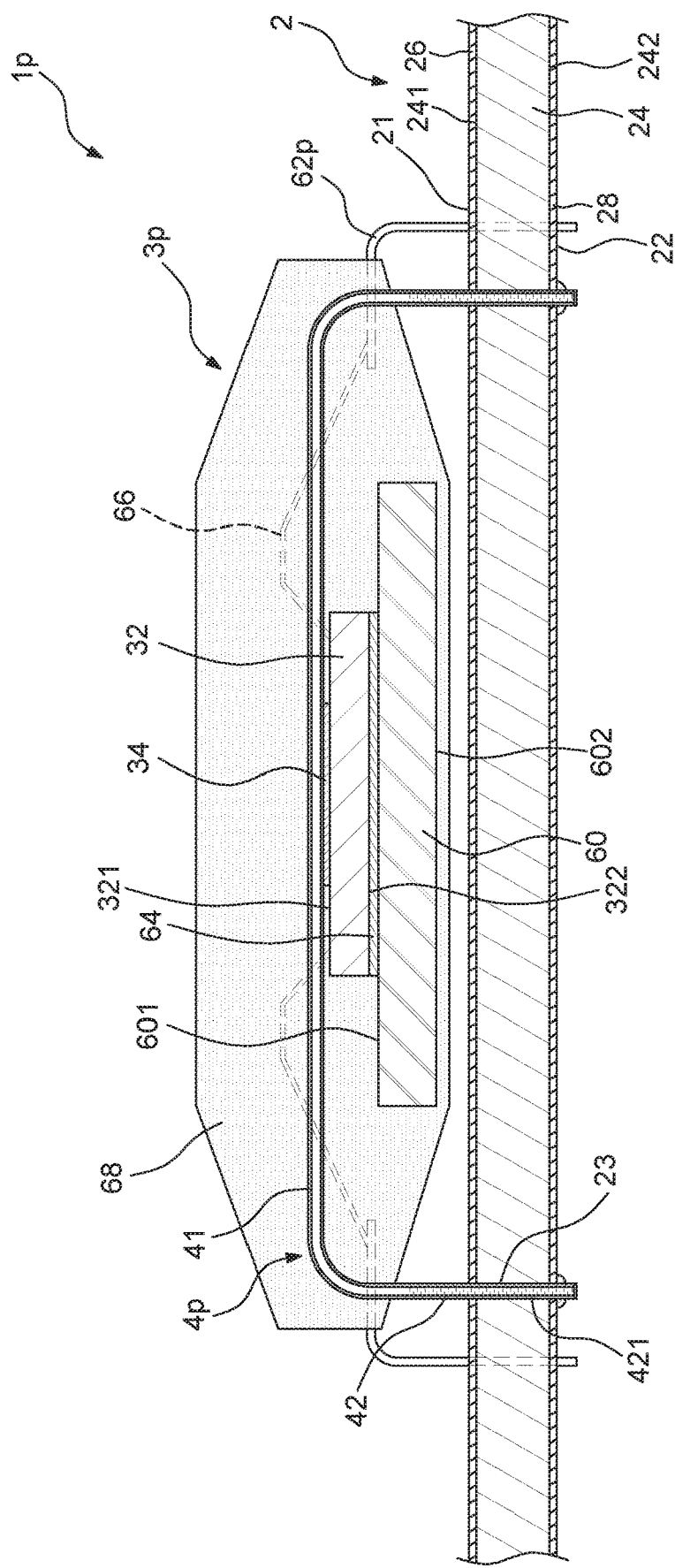
FIG. 27 illustrates a cross-sectional view of the electronic device of FIG. 26.

FIG. 25 illustrates an exploded perspective view of an electronic device 1p according to some embodiments of the present disclosure. FIG. 26 illustrates an assembled perspective view of the electronic device 1p of FIG. 25. FIG. 27 illustrates a cross-sectional view of the electronic device 1p of FIG. 26. The electronic device 1p is similar to the electronic device 1m of FIG. 19 to FIG. 21, and the differences are described as follows. In the electronic device 1p of FIG. 25 to FIG. 26, the two second portions 42 of the heat pipe 4p penetrate through the main substrate 2. In addition, the end portion of the lead 62p also penetrates through the main substrate 2.

Figure 28:
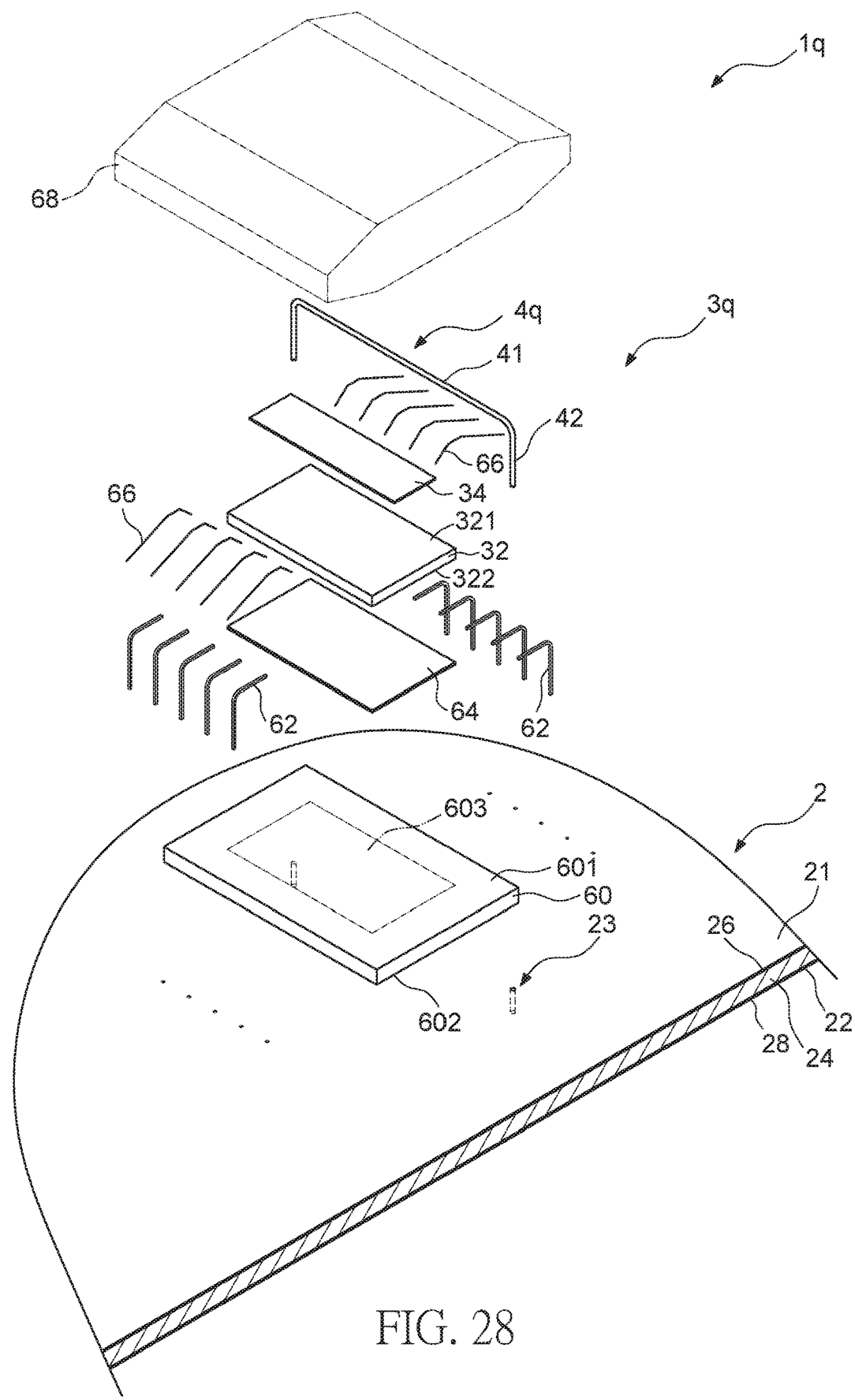
FIG. 28 illustrates an exploded perspective view of an electronic device according to some embodiments of the present disclosure.
Figure 29:
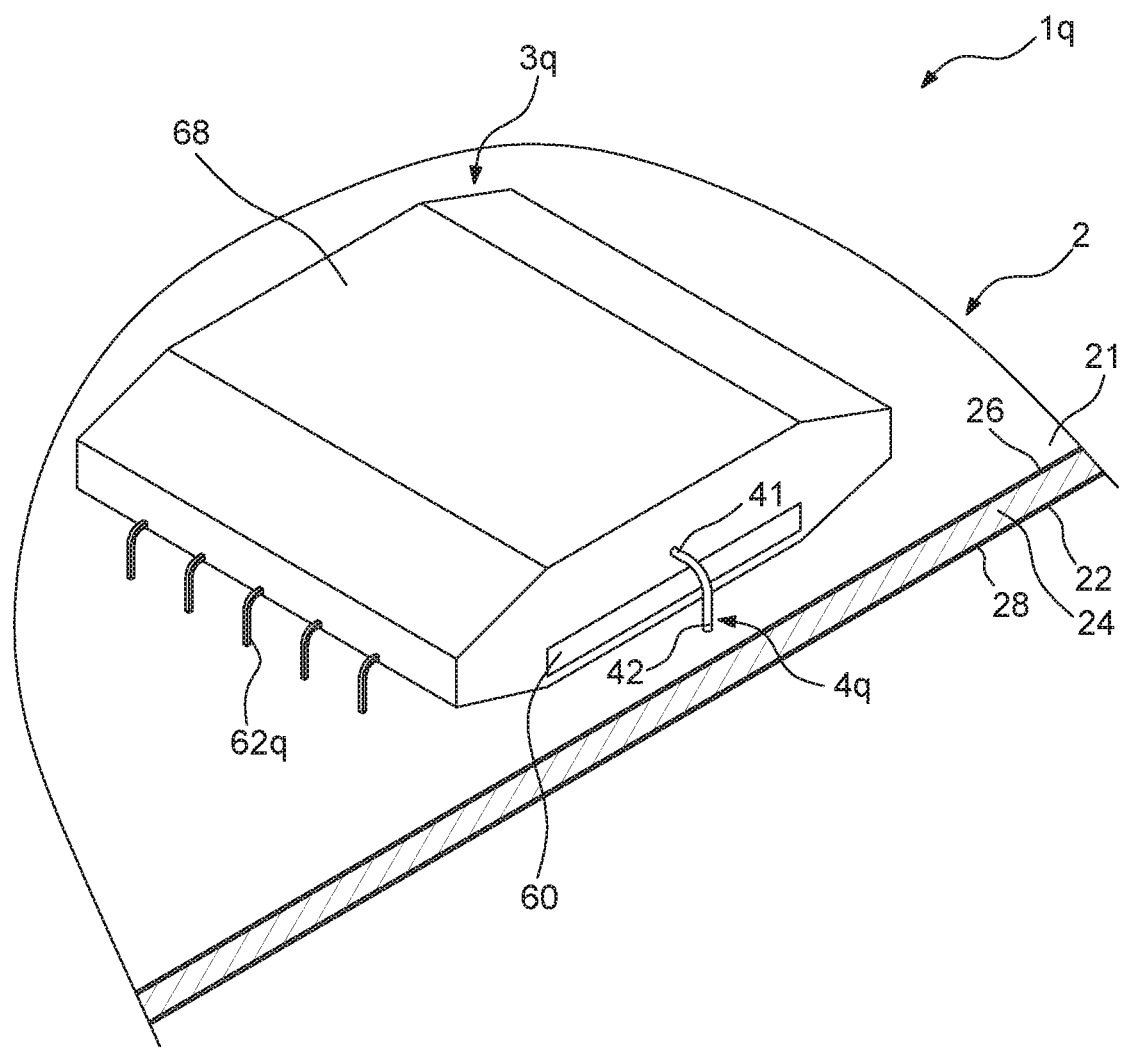
FIG. 29 illustrates an assembled perspective view of the electronic device of FIG. 28.
Figure 30:
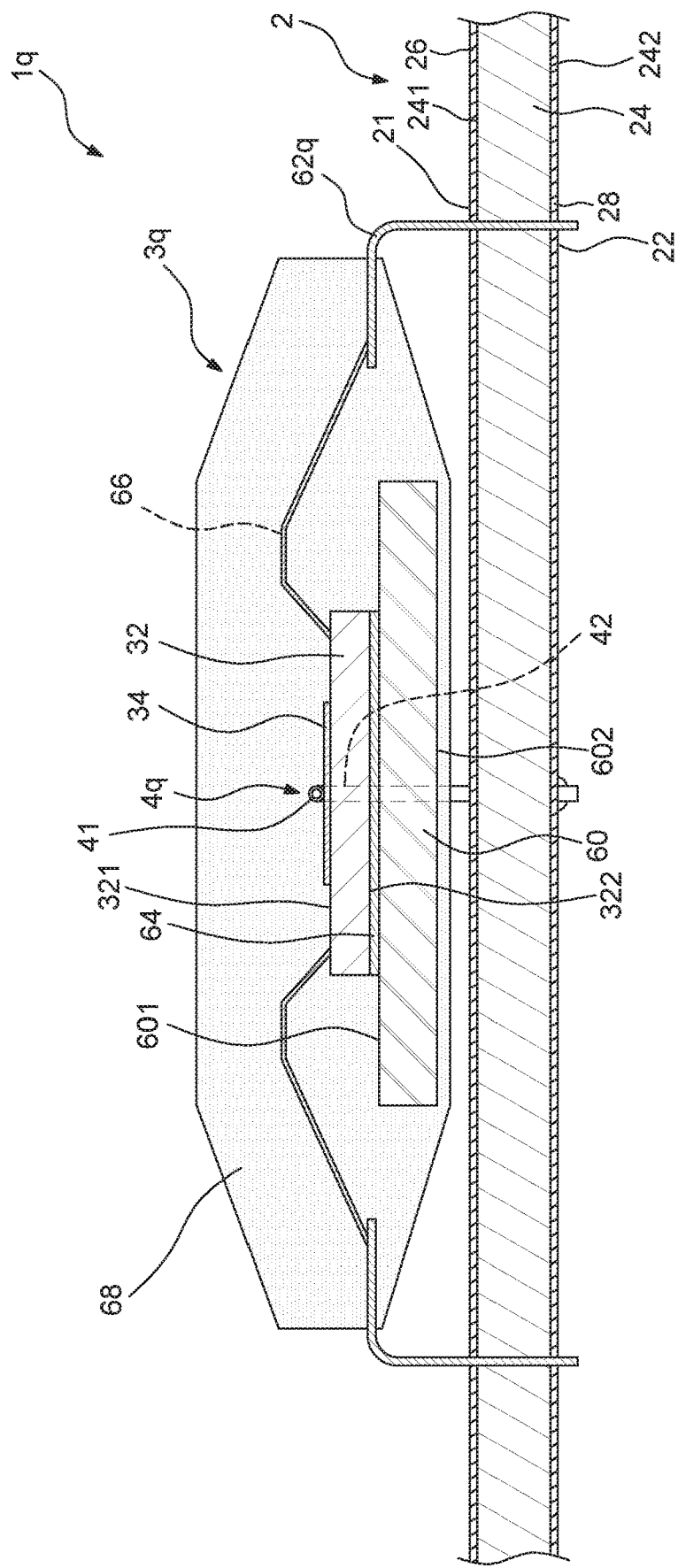
FIG. 30 illustrates a cross-sectional view of the electronic device of FIG. 29.

FIG. 28 illustrates an exploded perspective view of an electronic device 1q according to some embodiments of the present disclosure. FIG. 29 illustrates an assembled perspective view of the electronic device 1q of FIG. 28. FIG. 30 illustrates a cross-sectional view of the electronic device 1q of FIG. 29. The electronic device 1q is similar to the electronic device 1n of FIG. 22 to FIG. 24, and the differences are described as follows. In the electronic device 1q of FIG. 28 to FIG. 30, the two second portions 42 of the heat pipe 4q penetrate through the main substrate 2. In addition, the end portion of the lead 62q also penetrates through the main substrate 2.

Figure 31:
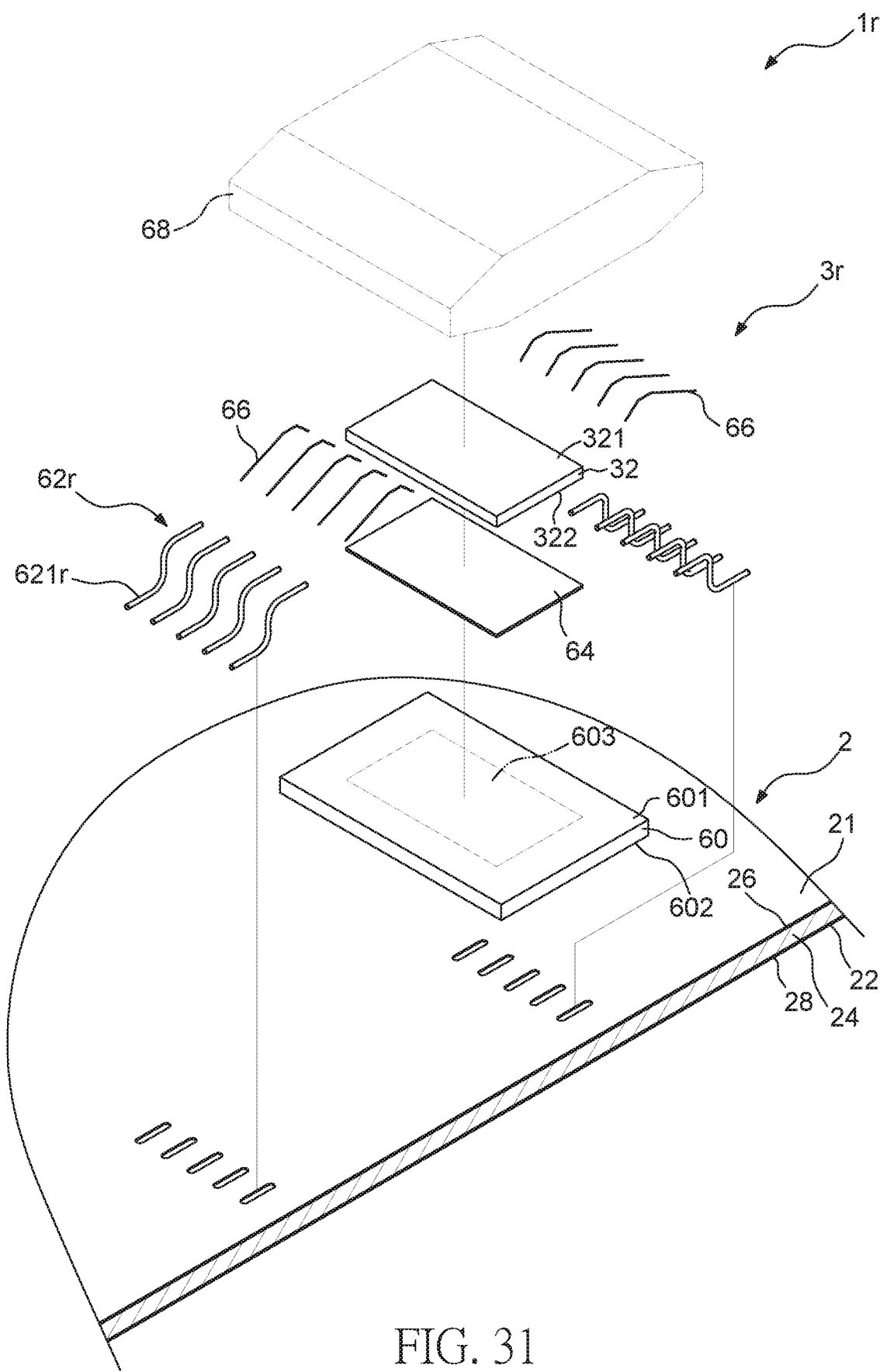
FIG. 31 illustrates an exploded perspective view of an electronic device according to some embodiments of the present disclosure.
Figure 32:
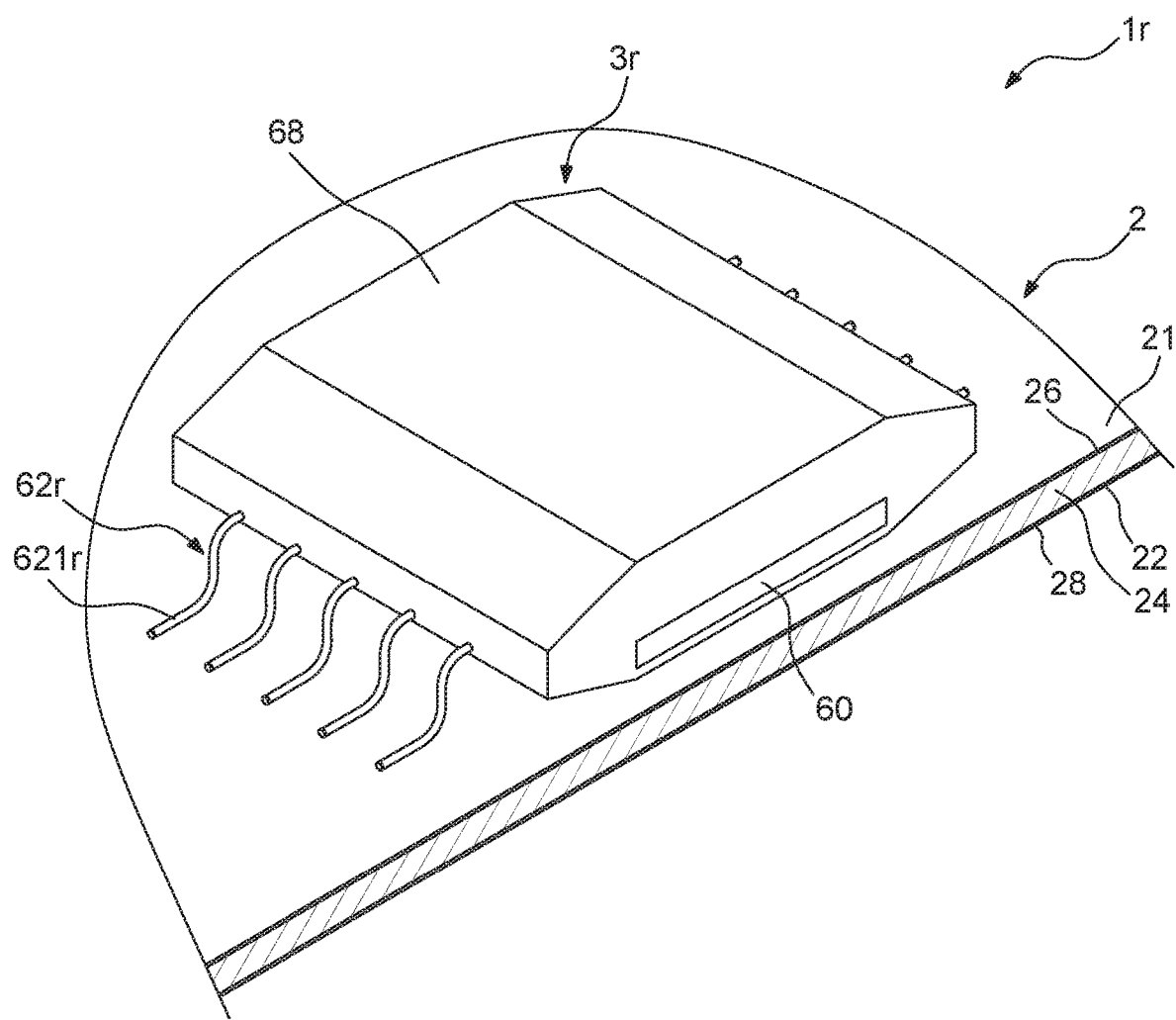
FIG. 32 illustrates an assembled perspective view of the electronic device of FIG. 31.
Figure 33:
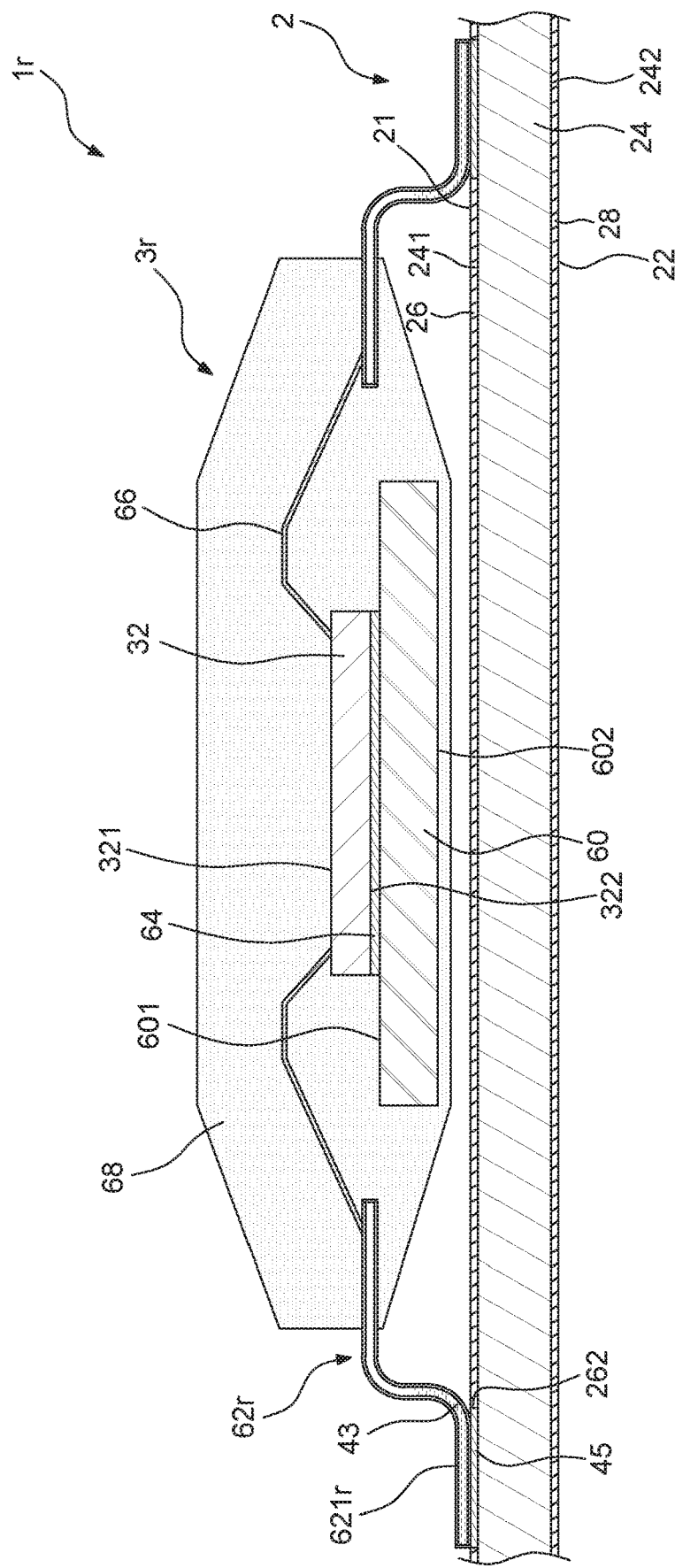
FIG. 33 illustrates a cross-sectional view of the electronic device of FIG. 32.

FIG. 31 illustrates an exploded perspective view of an electronic device 1r according to some embodiments of the present disclosure. FIG. 32 illustrates an assembled perspective view of the electronic device 1r of FIG. 31. FIG. 33 illustrates a cross-sectional view of the electronic device 1r of FIG. 32. The electronic device 1r is similar to the electronic device 1m of FIG. 19 to FIG. 21, and the differences are described as follows. In the electronic device 1r of FIG. 31 to FIG. 33, the heat pipes 4m of FIG. FIG. 19 to FIG. 21 are omitted, and the leads 62r are in the types of heat pipes rather than solid strips. The semiconductor die 32 is electrically connected to the leads 62r (e.g., the heat pipes) through the bonding wires 66. The cover structure 68 covers the semiconductor die 32, the die attach pad 60, the bonding wires 66, and portions of the leads 62r (e.g., the heat pipes). The end portion 621r of the lead 62r (e.g., the heat pipes) is a horizontal segment disposed on the first surface 21 of the main substrate 2. In addition, the end portion 621r of the lead 62r (e.g., the heat pipes) is thermally connected and electrically connected to the main body 24 of the main substrate 2. That is, the lead 62r (e.g., the heat pipes) is a thermal connection path and is also an electrical connection path.

Figure 34:
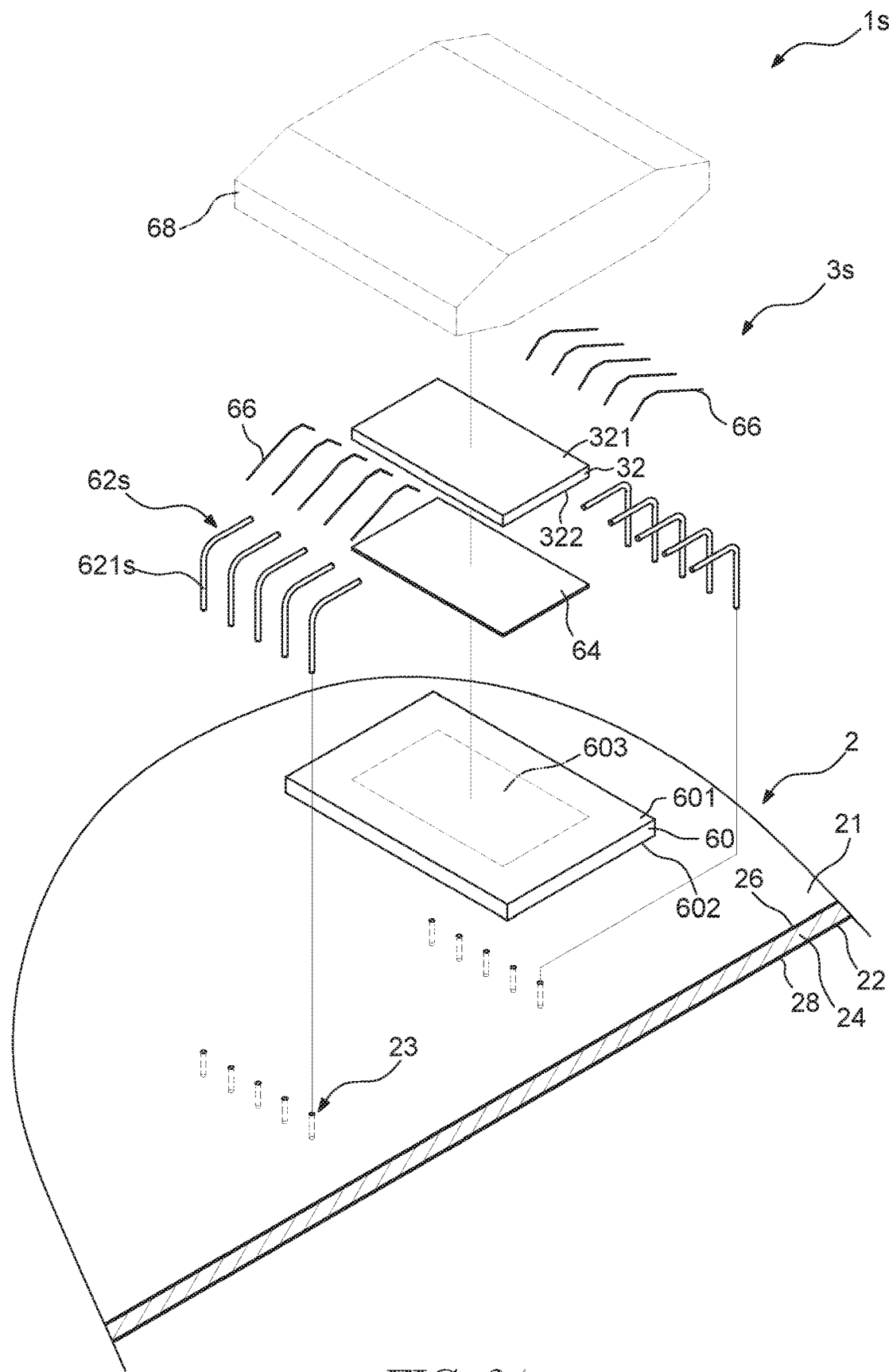
FIG. 34 illustrates an exploded perspective view of an electronic device according to some embodiments of the present disclosure.
Figure 35:
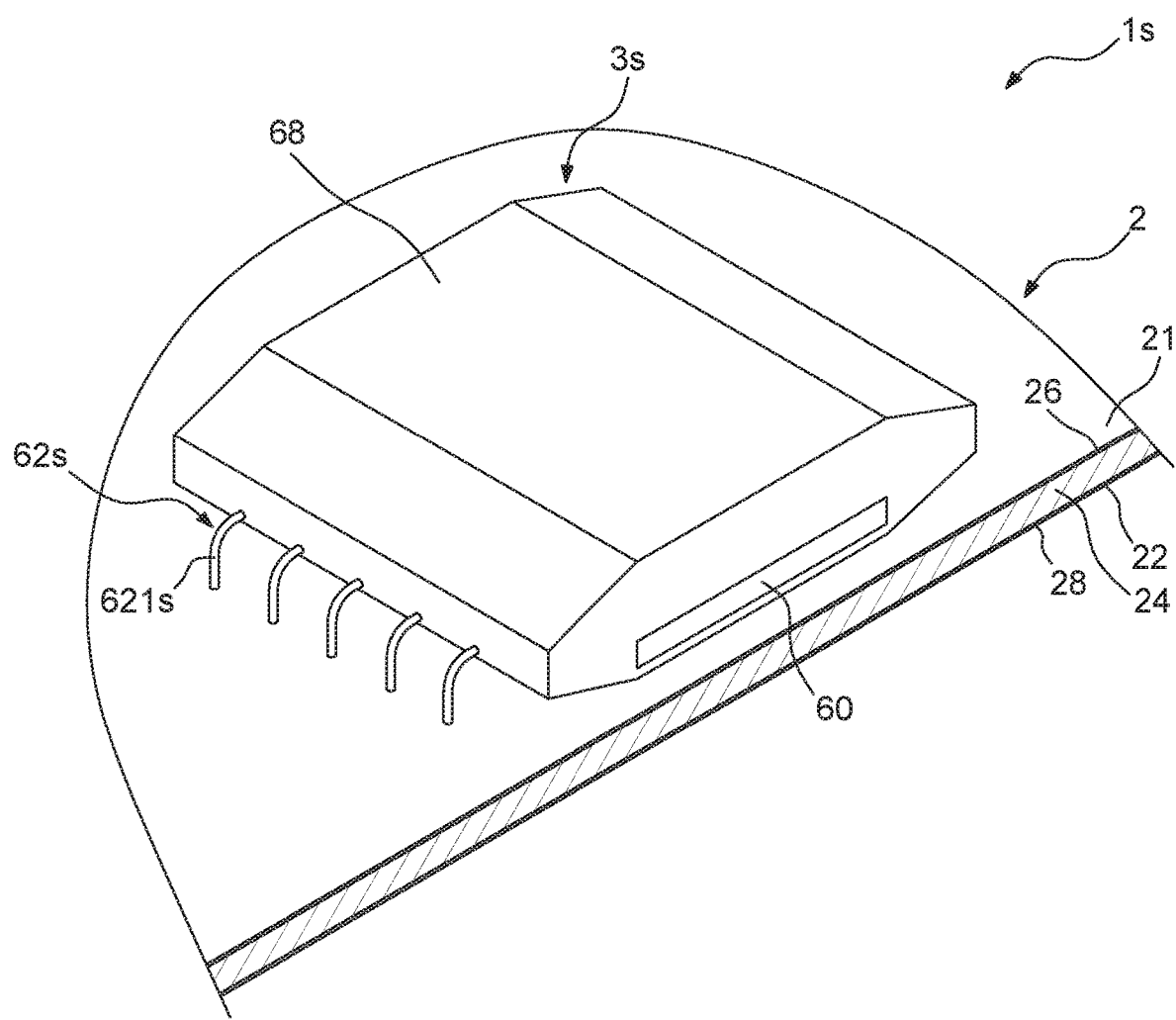
FIG. 35 illustrates an assembled perspective view of the electronic device of FIG. 34.
Figure 36:
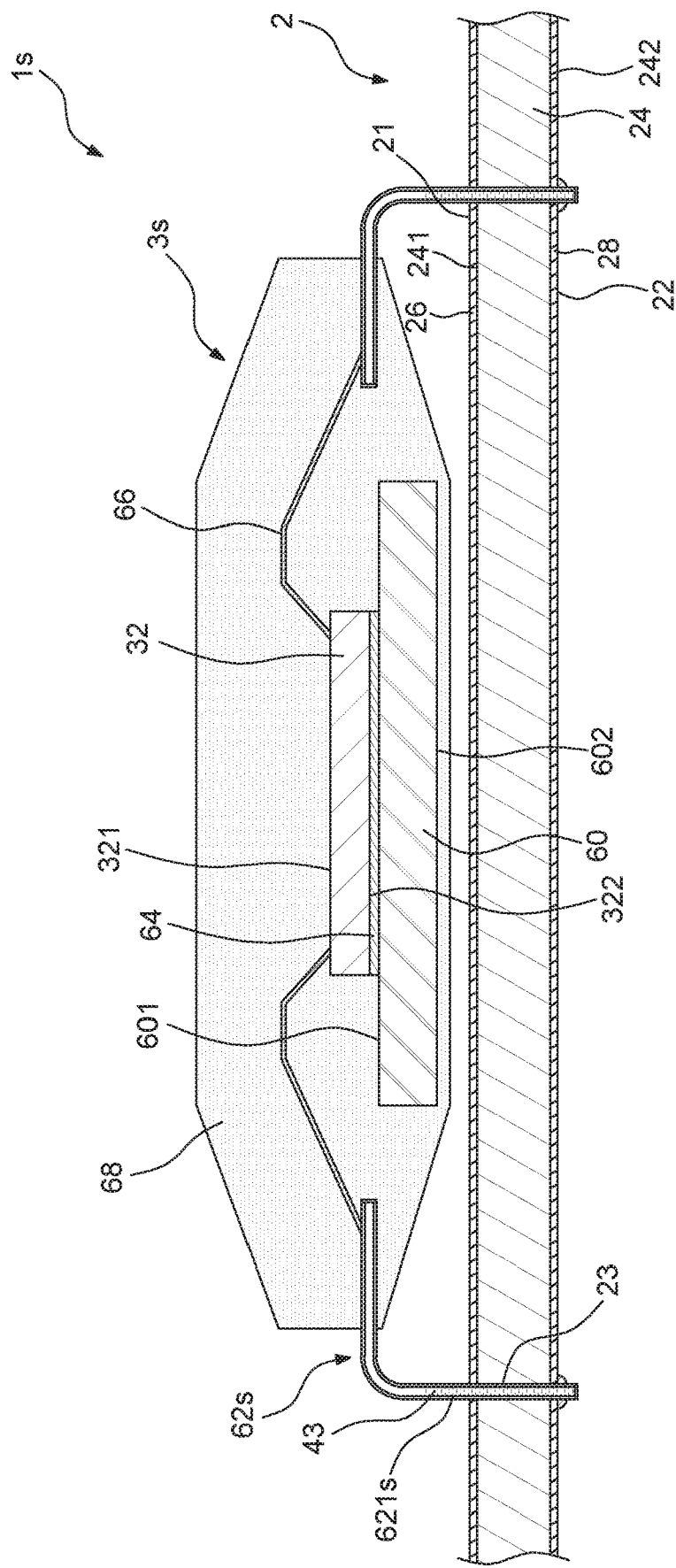
FIG. 36 illustrates a cross-sectional view of the electronic device of FIG. 35.

FIG. 34 illustrates an exploded perspective view of an electronic device 1s according to some embodiments of the present disclosure. FIG. 35 illustrates an assembled perspective view of the electronic device 1s of FIG. 34. FIG. 36 illustrates a cross-sectional view of the electronic device 1s of FIG. 35. The electronic device 1s is similar to the electronic device 1r of FIG. 31 to FIG. 33, and the differences are described as follows. In the electronic device 1s of FIG. 34 to FIG. 36, the end portions 621s of the leads 62s (e.g., the heat pipes) penetrate through the main substrate 2.

Figure 37:
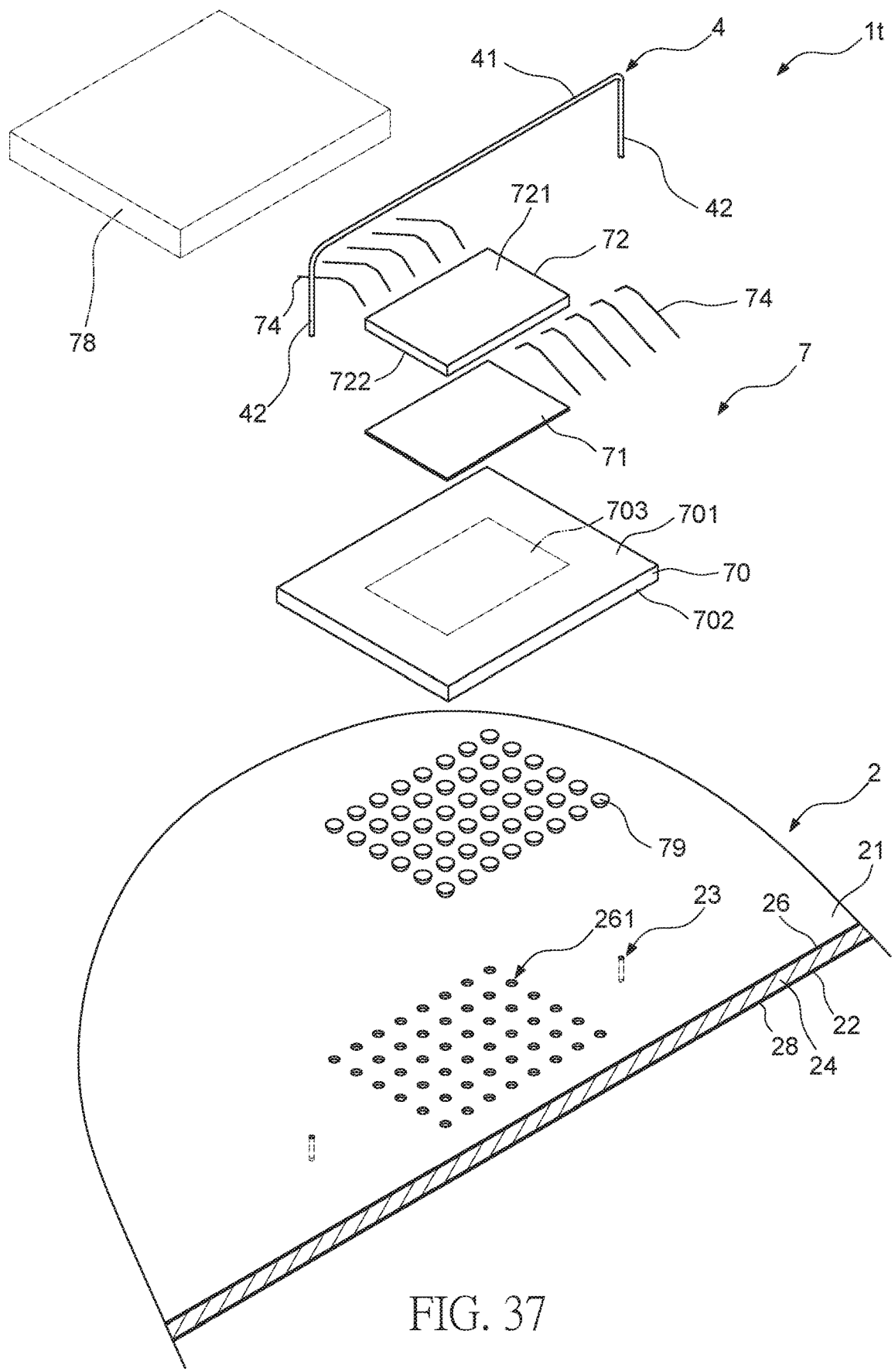
FIG. 37 illustrates an exploded perspective view of an electronic device according to some embodiments of the present disclosure.
Figure 38:
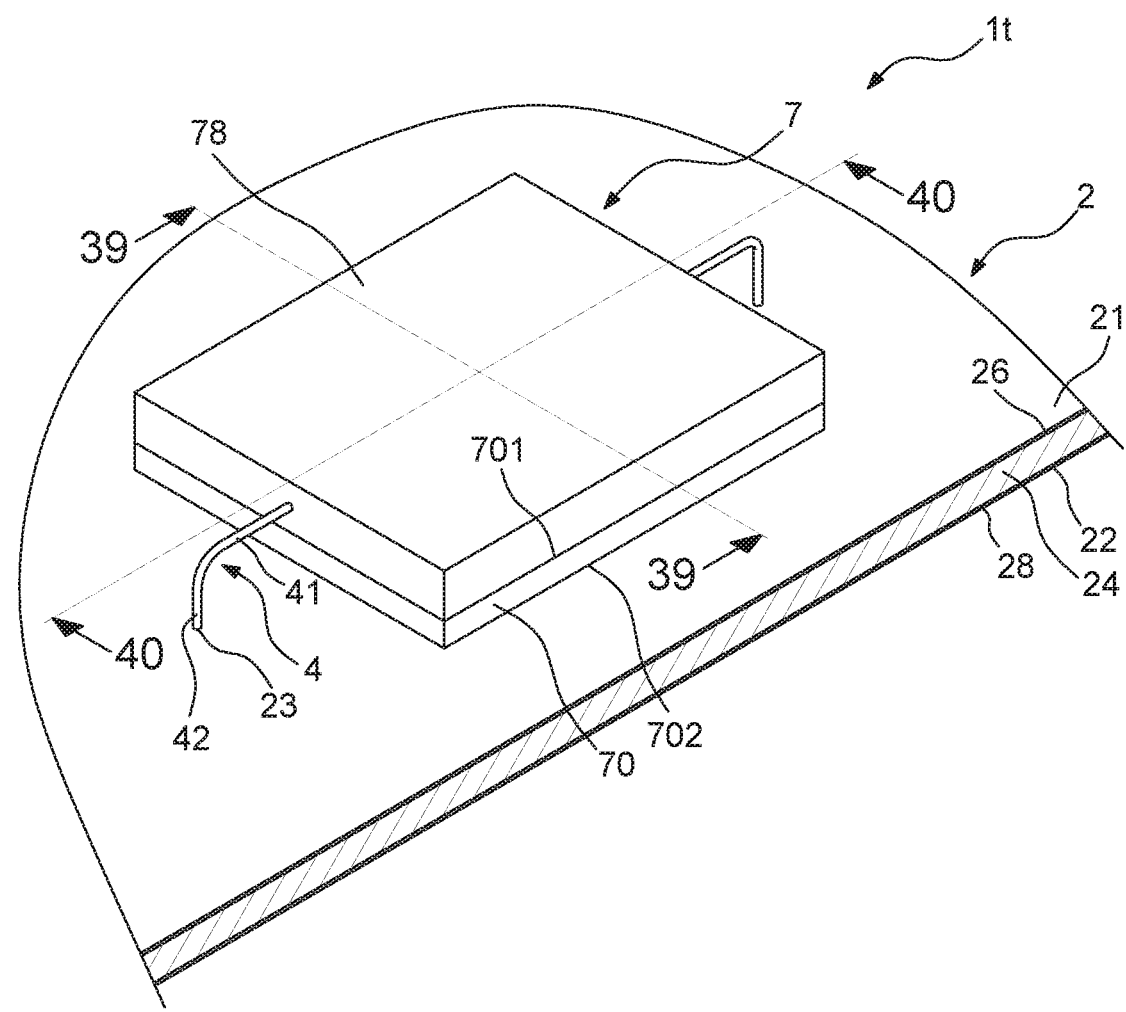
FIG. 38 illustrates an assembled perspective view of the electronic device of FIG. 37.
Figure 39:
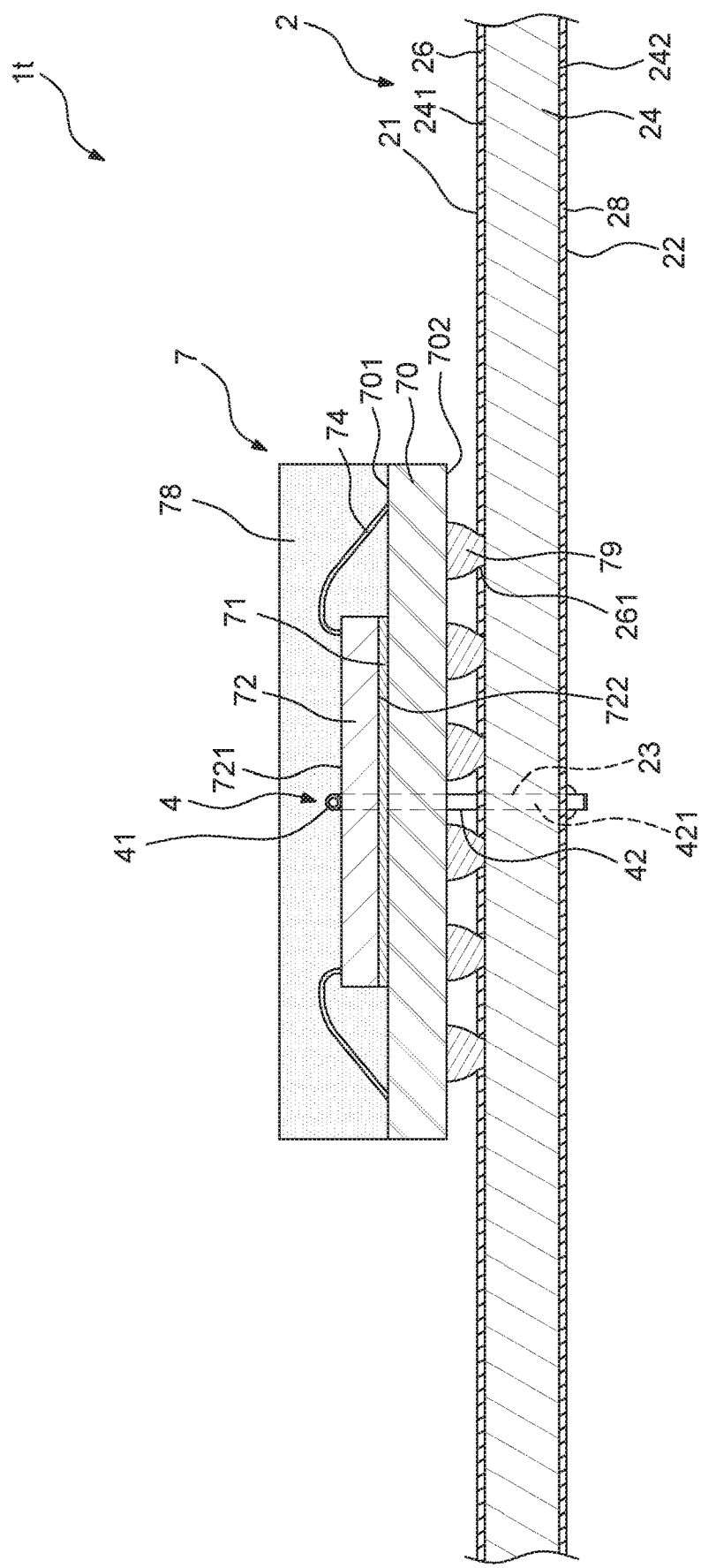
FIG. 39 illustrates a cross-sectional view taken a line of 39-39 of the electronic device of FIG. 38.
Figure 40:
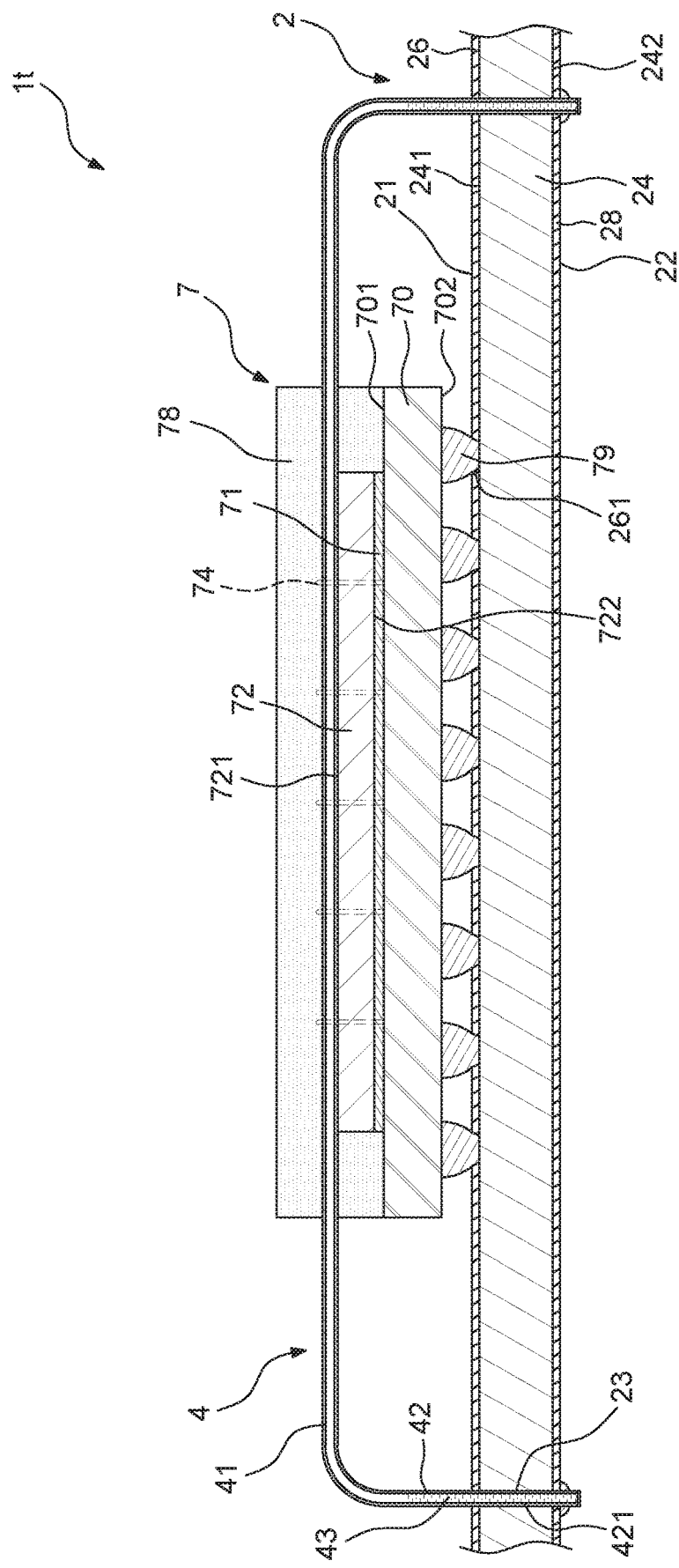
FIG. 40 illustrates a cross-sectional view taken a line of 40-40 of the electronic device of FIG. 38.

FIG. 37 illustrates an exploded perspective view of an electronic device 1t according to some embodiments of the present disclosure. FIG. 38 illustrates an assembled perspective view of the electronic device 1t of FIG. 37. FIG. 39 illustrates a cross-sectional view taken a line of 39-39 of the electronic device 1t of FIG. 38. FIG. 40 illustrates a cross-sectional view taken a line of 40-40 of the electronic device 1t of FIG. 38. The electronic device 1t includes the main substrate 2, a semiconductor package structure 7 and at least one heat pipe 4.

The main substrate 2 (e.g., a printed circuit board, PCB) is similar to the main substrate 2 of FIG. 1 and FIG. 2. The main substrate 2 has a first surface 21 (e.g., a top surface) and a second surface 22 (e.g., a bottom surface) opposite to the first surface 21, and includes a main body 24, a first protection layer 26, a second protection layer 28. The main body 24 has a first surface 241 (e.g., a top surface) and a second surface 242 (e.g., a bottom surface) opposite to the first surface 241. The first protection layer 26 and the second protection layer 28 may be solder resist layers. The main substrate 2 defines a plurality of through holes 23 extending the main substrate 2. That is, the through holes 23 extend through the main body 24, the first protection layer 26 and the second protection layer 28. In addition, the first protection layer 26 may define a plurality of openings 261 extending through the first protection layer 26 to expose portions of the circuit layer of the main body 24.

The semiconductor package structure 7 may be a wire bonding BGA package, and is electrically connected to the first surface 21 of the main substrate 2. The semiconductor package structure 7 includes a package substrate 70, a semiconductor die 72, a die attach adhesive 71, a plurality of bonding wires 74, a cover structure 78 and a plurality of external connecting elements 79 (e.g., solder bumps). The package substrate 70 has a first surface 701 (e.g., a top surface) and a second surface 702 (e.g., a bottom surface) opposite to the first surface 701, and may include a plurality of passivation layers and at least one circuit layer (e.g., redistribution layer, RDL) interposed between the passivation layers. The package substrate 70 may further include a die mounting portion 703 for receiving the semiconductor die 72. The semiconductor die 72 is electrically connected to the first surface 701 of the package substrate 70. The semiconductor die 72 has a first surface 721 (e.g., an active surface) and a second surface 722 (e.g., a backside surface) opposite to the first surface 721. The second surface 722 of the semiconductor die 72 is attached to the die mounting portion 703 of the package substrate 70 through the die attach adhesive 71. The first surface 721 of the semiconductor die 72 is electrically connected to the first surface 701 of the package substrate 70 through the bonding wires 74. The cover structure 78 may be a molding compound that covers the first surface 701 of the package substrate 70, the semiconductor die 72 and the bonding wires 74.

The heat pipe 4 contacts the cover structure 78 (e.g., the molding compound) for dissipating a heat generated by the semiconductor die 72. In one embodiment, the heat pipe 4 is a U-shaped heat pipe, and includes one first portion 41 and two second portions 42. The first portion 41 connects the two second portions 42. The first portion 41 of the heat pipe 4 is disposed on and contacts the first surface 721 of the semiconductor die 72, and covered by the cover structure 78 (e.g., the molding compound). That is, the first portion 41 of the heat pipe 4 is embedded in the cover structure 78 (e.g., the molding compound). The two second portions 42 penetrate through the main substrate 2. The extending direction of the first portion 41 of the heat pipe 4 is perpendicular to the extending directions of the bonding wires 74. Thus, the first portion 41 of the heat pipe 4 is disposed between the two rows of the bonding wires 74. For example, as shown in FIG. 39, the extending direction of the first portion 41 of the heat pipe 4 is the normal direction of FIG. 39, and the extending directions of the bonding wires 74 is from a right side to a left side or from a left side to a right side of FIG. 39.

As shown in FIG. 37 to FIG. 40, during the operation of the semiconductor die 72, the heat generated by the semiconductor die 72 will be absorbed by the first portion 41 of the heat pipe 4 and transferred or conducted to the end portion 421 of the second portion 42 of the heat pipe 4. Then, the heat of the end portion 421 of the second portion 42 of the heat pipe 4 is carried out by the copper layer of the main substrate 2 or other heat dissipation device. Since the first portion 41 of the heat pipe 4 is very close to the first surface 721 of the semiconductor die 72, the heat dissipation efficiency is relatively high.

Figure 41:
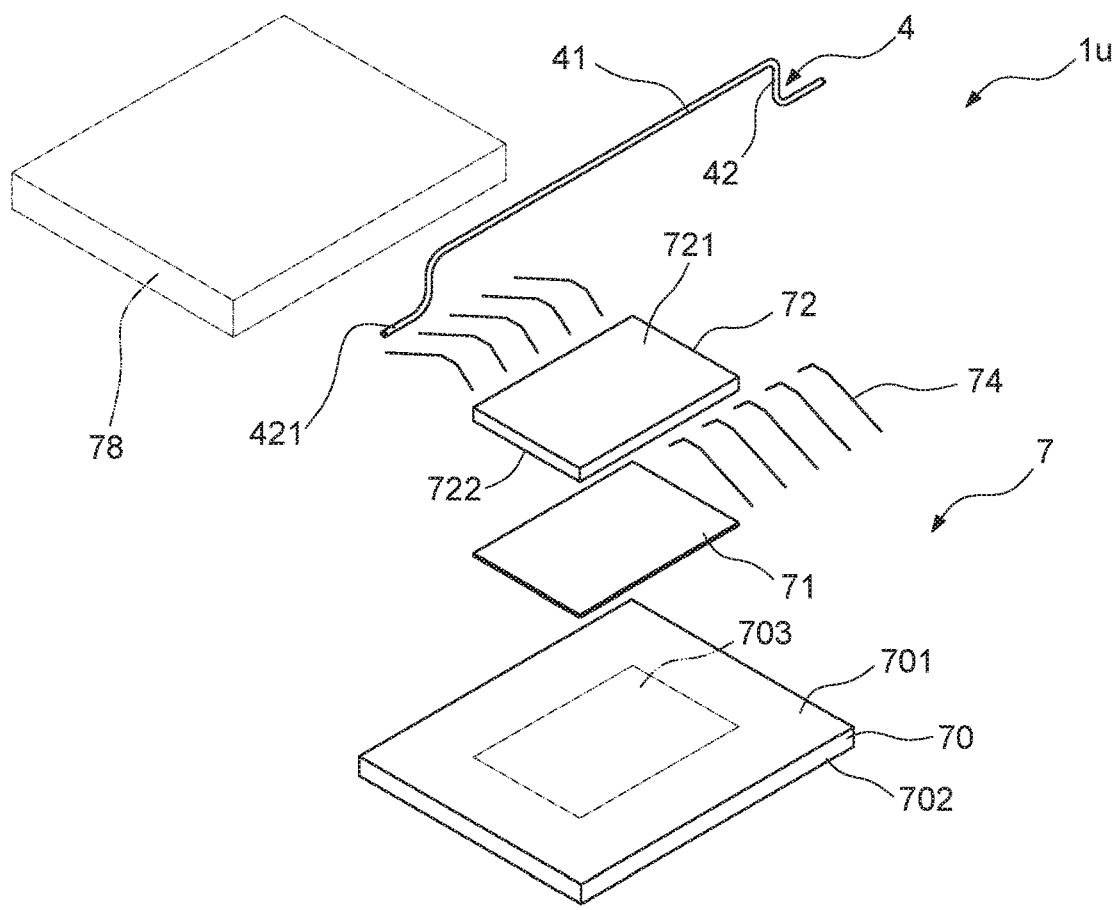
FIG. 41 illustrates an exploded perspective view of an electronic device according to some embodiments of the present disclosure.
Figure 41:
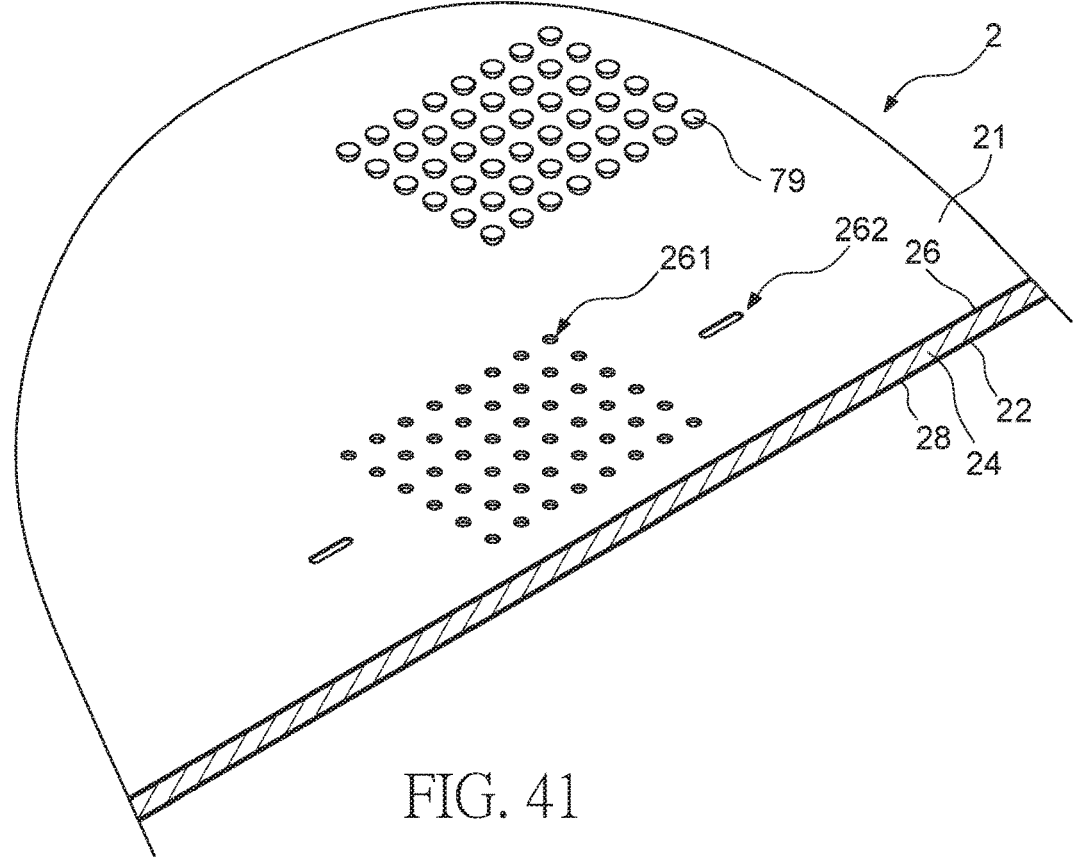
Figure 42:
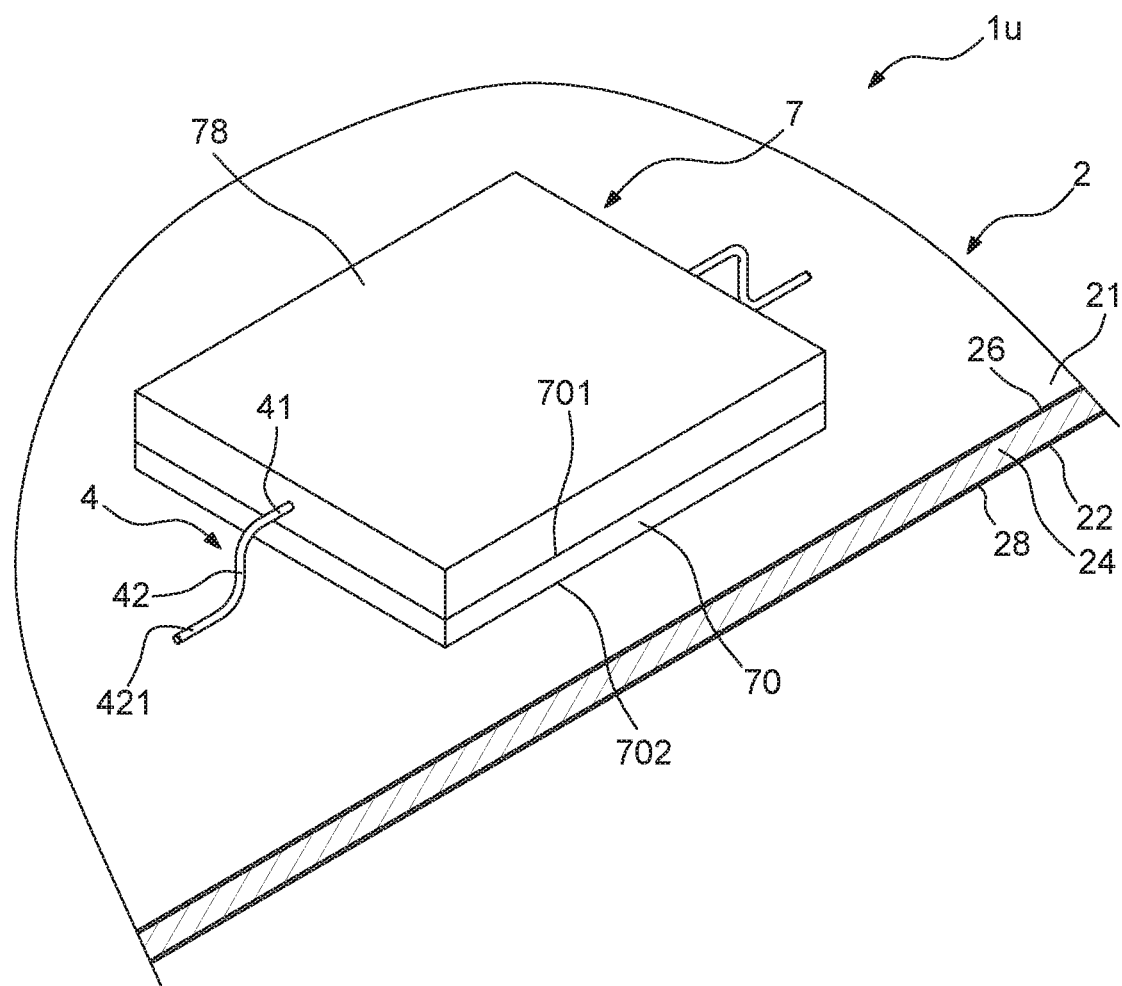
FIG. 42 illustrates an assembled perspective view of the electronic device of FIG. 41.
Figure 43:
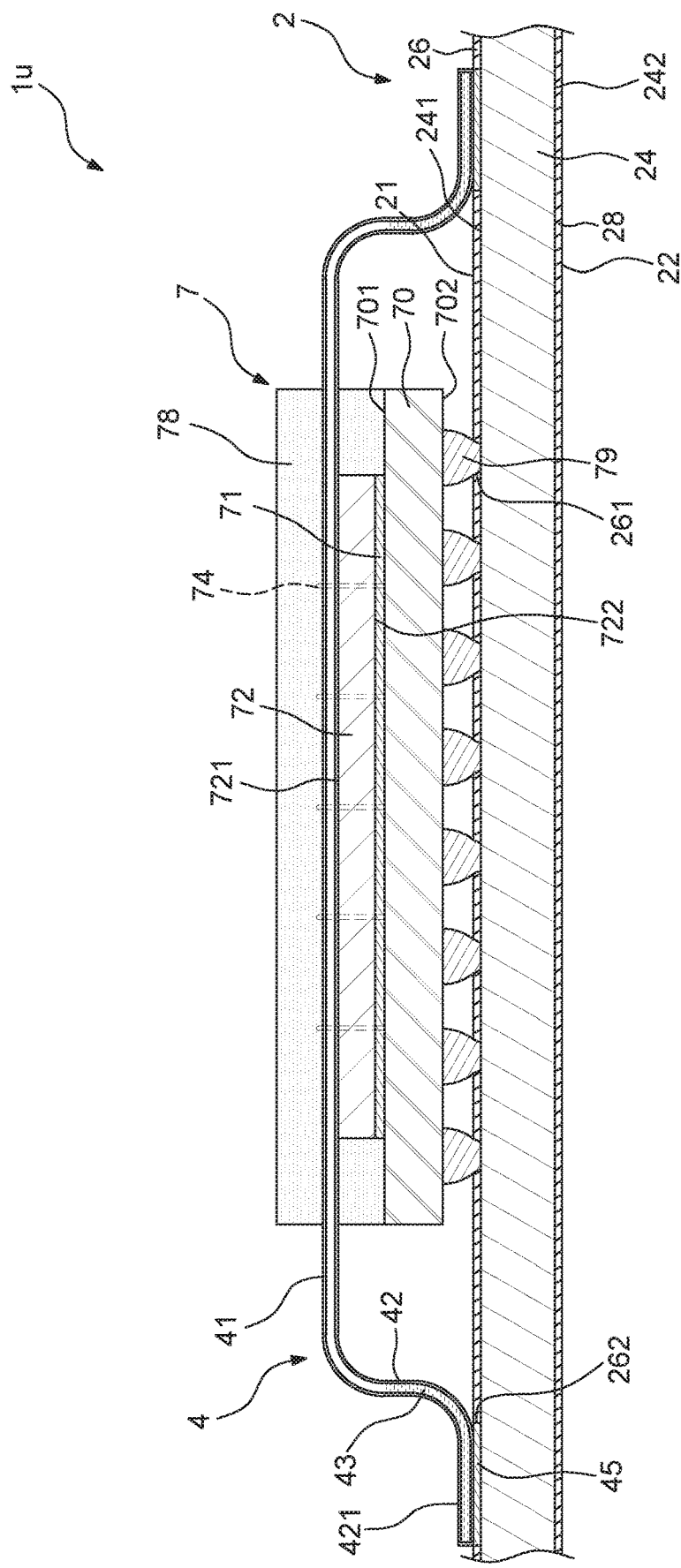
FIG. 43 illustrates a cross-sectional view of the electronic device of FIG. 42.

FIG. 41 illustrates an exploded perspective view of an electronic device 1u according to some embodiments of the present disclosure. FIG. 42 illustrates an assembled perspective view of the electronic device 1u of FIG. 41. FIG. 43 illustrates a cross-sectional view of the electronic device 1u of FIG. 42. The electronic device 1u is similar to the electronic device 1t of FIG. 37 to FIG. 40, and the differences are described as follows. The end portion 421 of the second portion 42 of the heat pipe 4 is a horizontal segment disposed on the first surface 21 of the main substrate 2. The end portion 421 of the second portion 42 of the heat pipe 4 is parallel with and disposed on the first surface 21 of the main substrate 2. In addition, the end portion 421 of the second portion 42 of the heat pipe 4 is thermally connected and physically connected to the main body 24 of the main substrate 2 through the solder material 45 in the opening 262 of the first protection layer 26.

Figure 44:
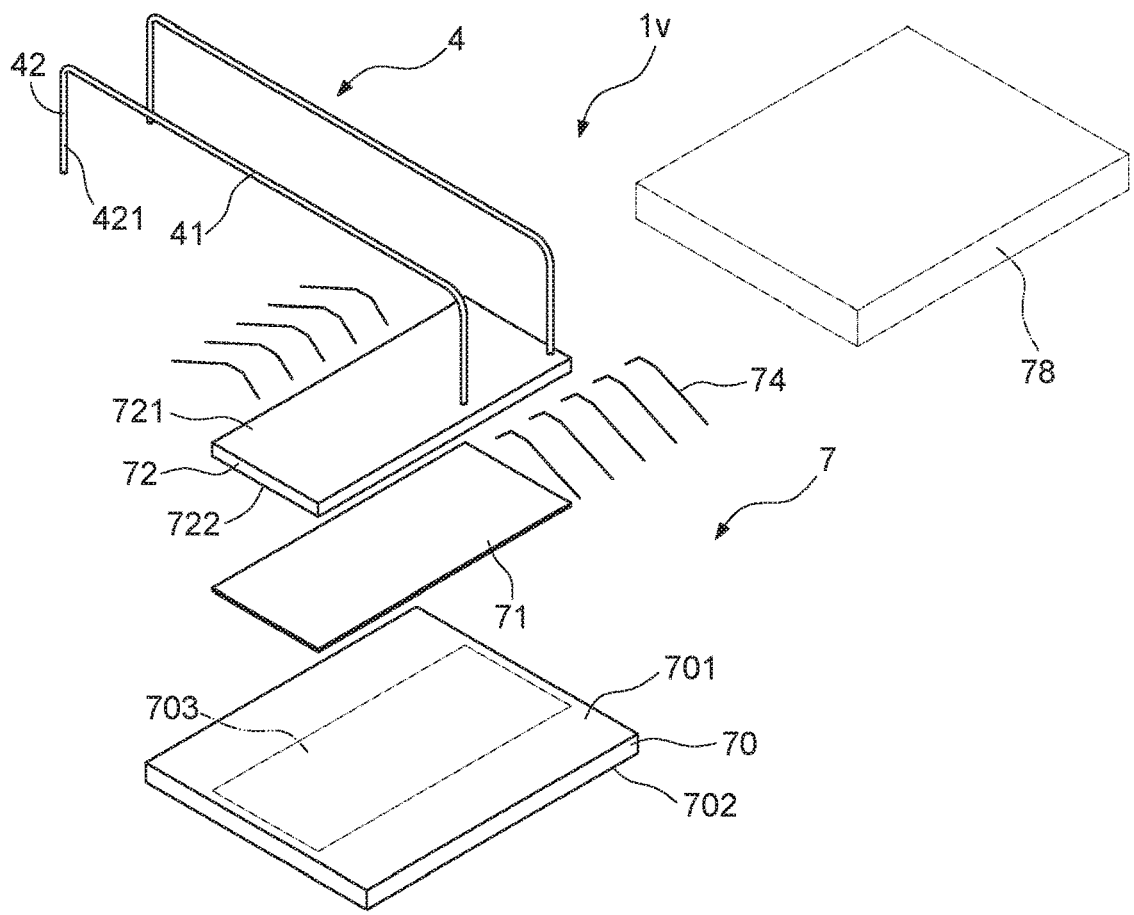
FIG. 44 illustrates an exploded perspective view of an electronic device according to some embodiments of the present disclosure.
Figure 44:
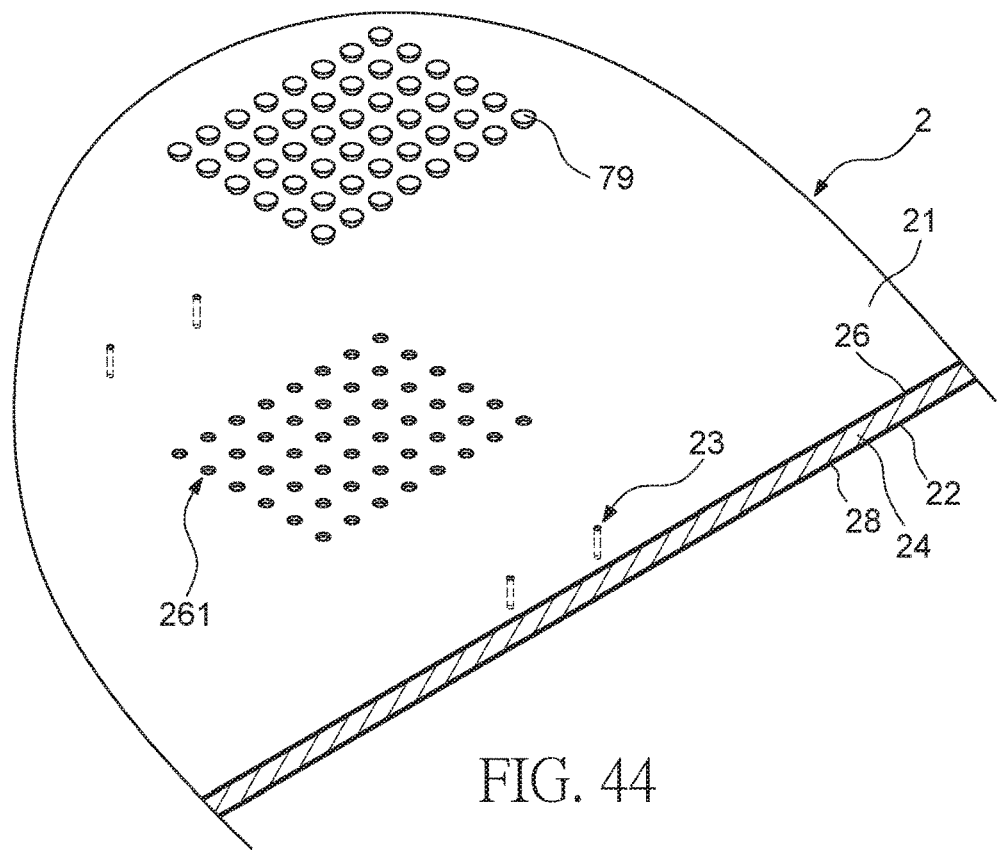
Figure 45:
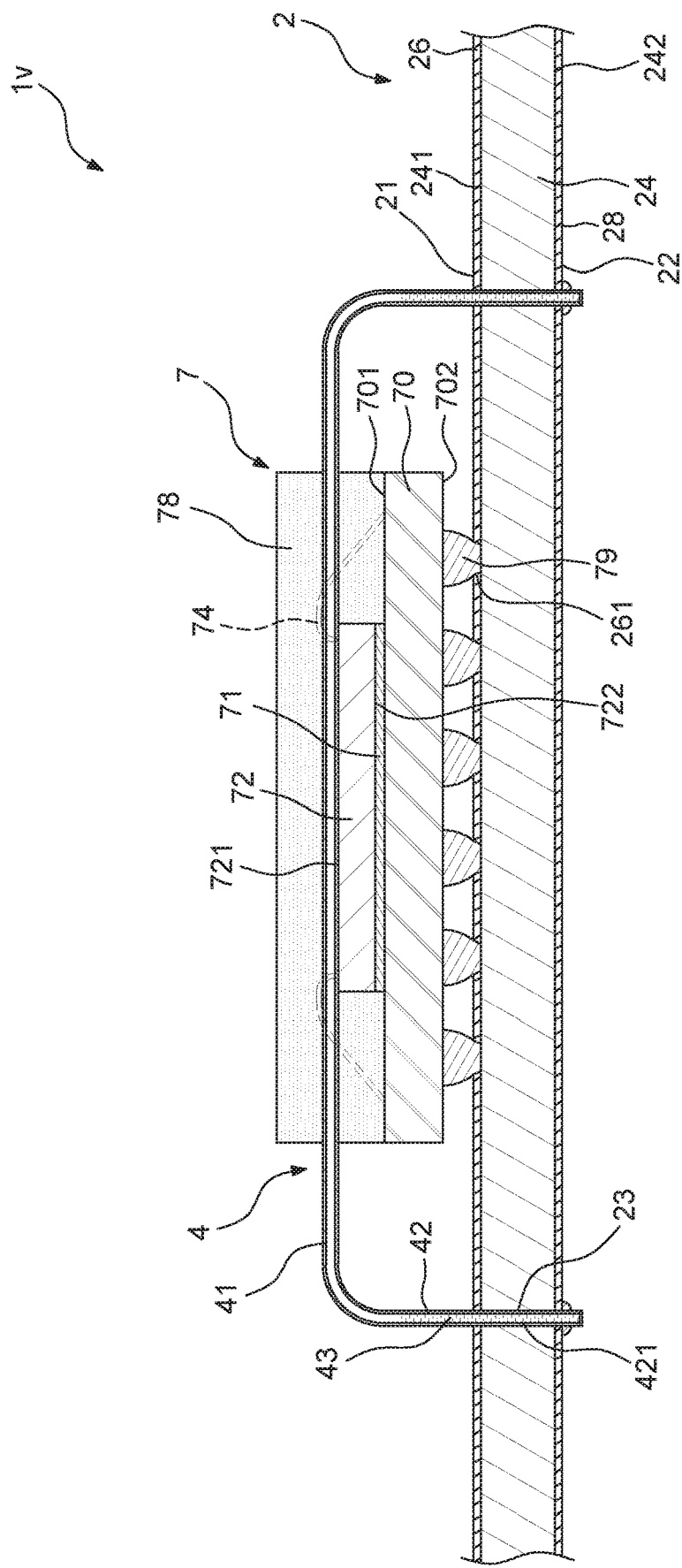
FIG. 45 illustrates a cross-sectional view of an assembled electronic device of FIG. 44.

FIG. 44 illustrates an exploded perspective view of an electronic device 1v according to some embodiments of the present disclosure. FIG. 45 illustrates a cross-sectional view of an assembled electronic device 1v of FIG. 44. The electronic device 1v is similar to the electronic device 1t of FIG. 37 to FIG. 40, and the differences are described as follows. The extending direction of the first portion 41 of the heat pipe 4 is parallel with the extending directions of the bonding wires 74. Thus, the first portion 41 of the heat pipe 4 is disposed adjacent to two opposite bonding wires 74. That is, the first portion 41 of the heat pipe 4 is disposed between two bonding wires 74 in a same row. For example, as shown in FIG. 45, the extending direction of the first portion 41 of the heat pipe 4 is from a right side to a left side or from a left side to a right side of FIG. 45, and the extending directions of the bonding wires 74 is from a right side to a left side or from a left side to a right side of FIG. 45.

Figure 46:
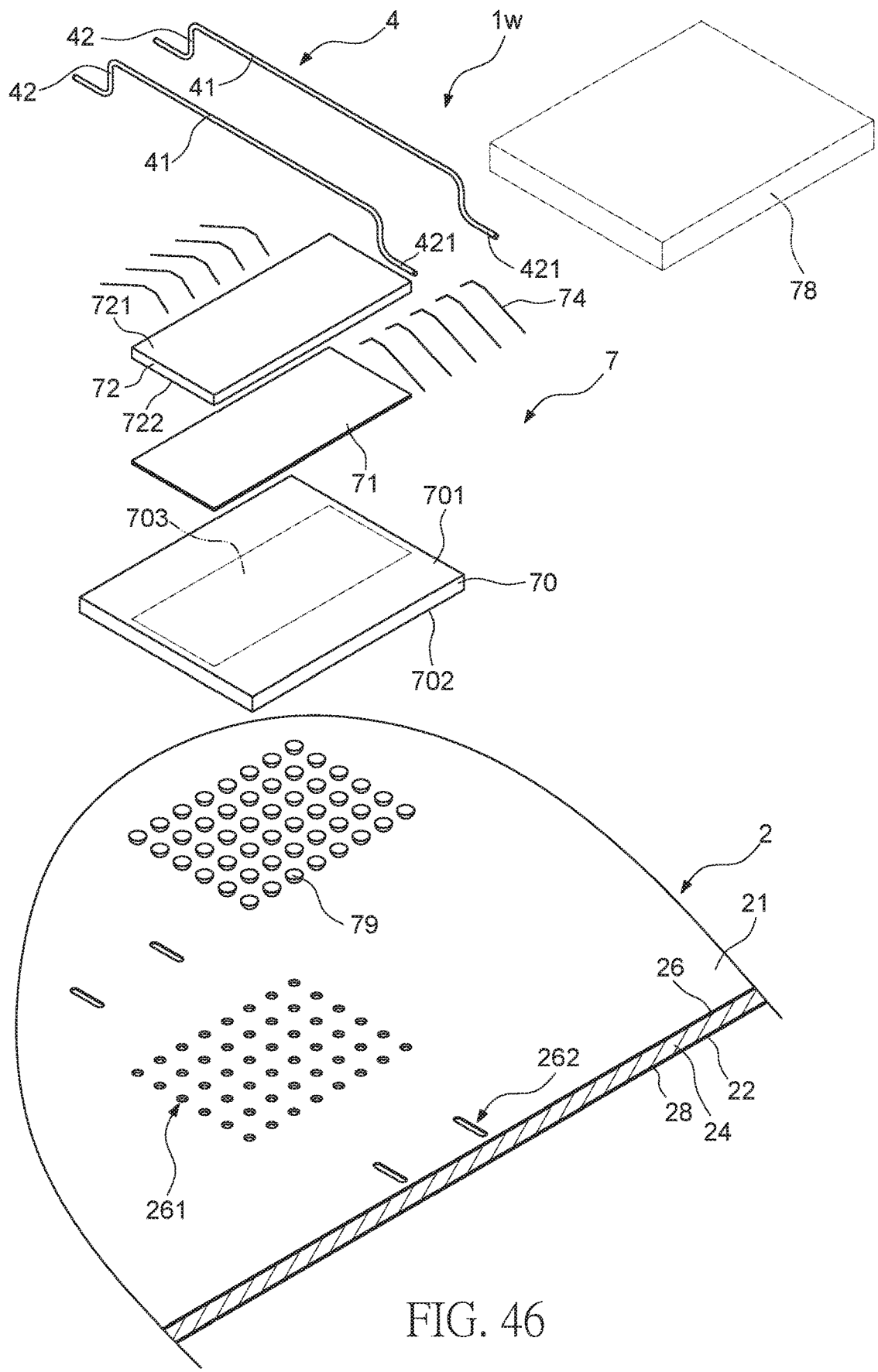
FIG. 46 illustrates an exploded perspective view of an electronic device according to some embodiments of the present disclosure.
Figure 47:
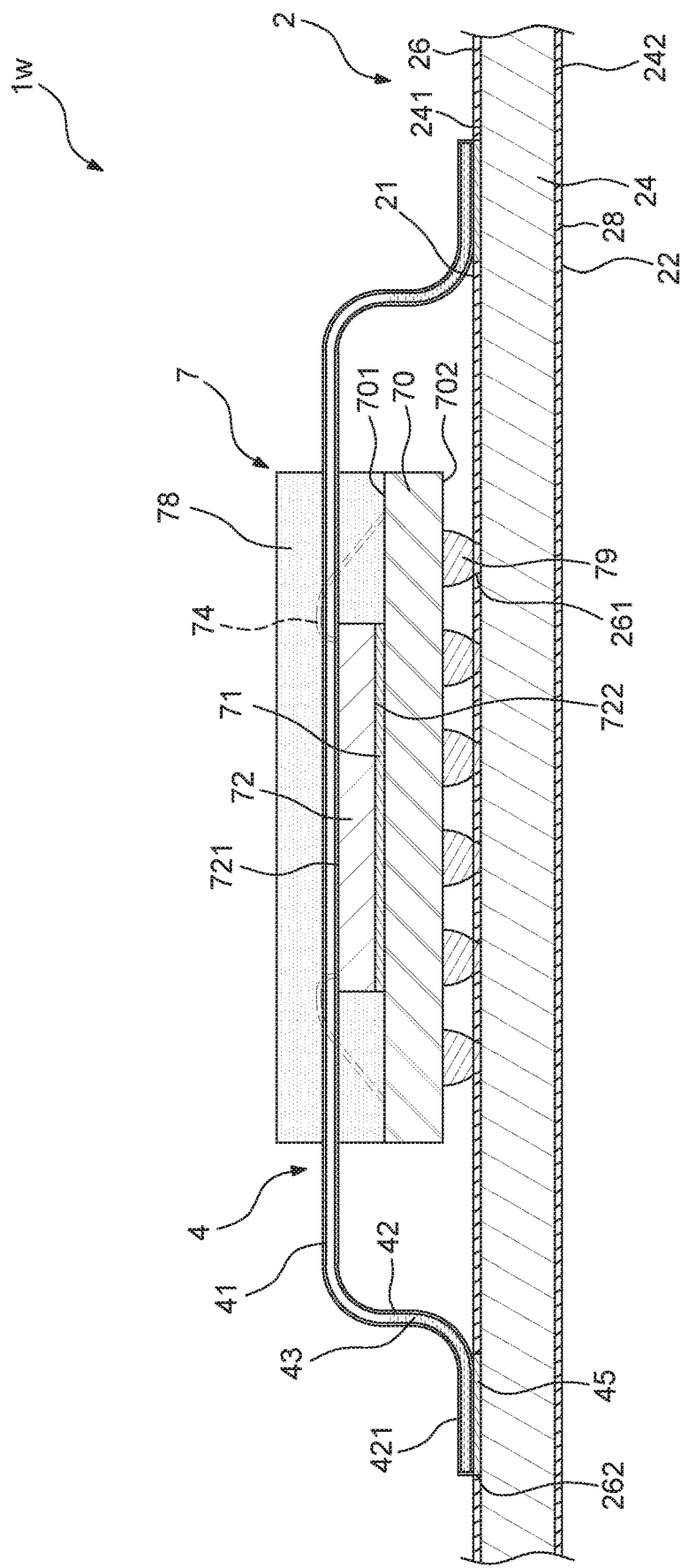
FIG. 47 illustrates a cross-sectional view of an assembled electronic device of FIG. 46.

FIG. 46 illustrates an exploded perspective view of an electronic device 1w according to some embodiments of the present disclosure. FIG. 47 illustrates a cross-sectional view of an assembled electronic device 1w of FIG. 46. The electronic device 1w is similar to the electronic device 1v of FIG. 44 to FIG. 45, and the differences are described as follows. The end portion 421 of the second portion 42 of the heat pipe 4 is a horizontal segment disposed on the first surface 21 of the main substrate 2. The end portion 421 of the second portion 42 of the heat pipe 4 is parallel with and disposed on the first surface 21 of the main substrate 2. In addition, the end portion 421 of the second portion 42 of the heat pipe 4 is thermally connected and physically connected to the main body 24 of the main substrate 2 through the solder material 45 in the opening 262 of the first protection layer 26.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
 a main substrate;
 a semiconductor package structure electrically connected to the main substrate, and comprising:
   a package substrate including a die mounting portion;
   a semiconductor die disposed on and attached to the die mounting portion of the package substrate, wherein the semiconductor die is electrically connected to the package substrate through a flip-chip bonding; and
   a cover structure covering the semiconductor die, wherein the cover structure is a lid structure covering the semiconductor die; and
 at least one heat pipe contacting the cover structure for dissipating a heat generated by the semiconductor die, wherein the heat pipe includes a first portion disposed on the lid structure and a second portion penetrating through the package substrate.

2. The electronic device of claim 1, wherein the semiconductor package structure further includes a thermal interface material (TIM) interposed between the semiconductor die and the lid structure.

3. The electronic device of claim 1, wherein the lid structure is a cap structure and contacts a surface of the package substrate.

4. The electronic device of claim 1, wherein the lid structure includes a base plate and four position pins disposed at four corners of the base plate, an inner surface of each of the position pins contacts a portion of a lateral surface of the package substrate.

5. The electronic device of claim 1, wherein the heat pipe includes a first portion disposed adjacent to the lid structure and a second portion disposed adjacent to the main substrate.

6. The electronic device of claim 5, wherein the heat pipe is a U-shaped heat pipe, and includes one first portion and two second portions, wherein the first portion connects the two second portions, the first portion is disposed on the lid structure, and the two second portions penetrate through the main substrate.

7. The electronic device of claim 5, wherein each of the second portions includes a horizontal segment disposed on a surface of the main substrate.

8. The electronic device of claim 5, further comprising a heat sink disposed on the first portion of the heat pipe.

9. The electronic device of claim 1, further comprising a heat sink, wherein the heat pipe include a first portion disposed adjacent to the lid structure and a second portion substantially perpendicular to the first portion, the heat sink is disposed on the first portion of the heat pipe and the second portion of the heat pipe is connected to the heat sink.

10. The electronic device of claim 1, wherein the heat pipe includes a first portion disposed on the lid structure and a second portion connecting to a thermal via of the package substrate.

11. The electronic device of claim 1, wherein the heat pipe is interposed between the semiconductor die and the lid structure.

12. The electronic device of claim 1, wherein the semiconductor package structure further comprises a package substrate, the package substrate includes the die mounting portion, the semiconductor die is attached to the die mounting portion of the package substrate and is electrically connected to the package substrate through a flip-chip bonding; the cover structure is a vapor chamber covering the semiconductor die; and the heat pipe include a first portion disposed adjacent to the vapor chamber and a second portion disposed adjacent to the main substrate.

13. The electronic device of claim 1, wherein the semiconductor package structure further comprises a package substrate, the package substrate includes the die mounting portion, the semiconductor die is attached to the die mounting portion of the package substrate and is electrically connected to the package substrate through a plurality of bonding wires; the cover structure is a molding compound covering the semiconductor die and the bonding wires; and the heat pipe include a first portion disposed adjacent to the molding compound and a second portion disposed adjacent to the main substrate.

14. The electronic device of claim 1, wherein the semiconductor package structure further comprises a die attach pad and a plurality of leads, the die attach pad includes the die mounting portion, the leads surround the die attach pad and are electrically connected to the main substrate, the semiconductor die is attached to the die mounting portion of the die attach pad and is electrically connected to the leads through a plurality of bonding wires; the cover structure is a molding compound covering the semiconductor die, the die attach pad, the bonding wires, and portions of the leads; and the heat pipe include a first portion disposed adjacent to the semiconductor die and a second portion disposed adjacent to the main substrate.

15. The electronic device of claim 14, wherein each of the second portions includes horizontal segment disposed on a surface of the main substrate.

16. The electronic device of claim 14, wherein a portion of each of the leads penetrated through the main substrate.

17. The electronic device of claim 1, wherein the semiconductor package structure further comprises a die attach pad and a plurality of heat pipes, the die attach pad includes the die mounting portion, the heat pipes surround the die attach pad and are electrically connected to the main substrate, the semiconductor die is attached to the die mounting portion of the die attach pad and is electrically connected to first portions of the heat pipes through a plurality of bonding wires; the cover structure is a molding compound covering the semiconductor die, the die attach pad, the bonding wires, and the first portions of the heat pipes; and the heat pipe further include a second portion disposed adjacent to the main substrate.

18. The electronic device of claim 17, wherein each of the second portions of the heat pipes includes horizontal segment disposed on a surface of the main substrate.

19. The electronic device of claim 17, wherein each of the second portions of the heat pipes penetrates through the main substrate.

* * * * *